(12) United States Patent
Mukherjee et al.

(10) Patent No.: US 7,533,309 B2
(45) Date of Patent: May 12, 2009

(54) TESTING MEMORIES USING ALGORITHM SELECTION

(76) Inventors: Nilanjan Mukherjee, 29290 SW. Parkway Ct., Apt 91, Wilsonville, OR (US) 97070; Joseph C. Rayhawk, 15248 NW. Germantown Rd., Portland, OR (US) 97231; Amrendra Kumar, 26170 SW. Canyon Creek Rd., Apt. #203, Wilsonville, OR (US) 97070

( * ) Notice: Subject to any disclaimer, the term of this patent is extended or adjusted under 35 U.S.C. 154(b) by 175 days.

(21) Appl. No.: 10/861,851

(22) Filed: Jun. 4, 2004

(65) Prior Publication Data

US 2005/0204231 A1  Sep. 15, 2005

Related U.S. Application Data

(60) Provisional application No. 60/548,656, filed on Feb. 26, 2004.

(51) Int. Cl.
*G11C 29/00* (2006.01)
*G11C 7/00* (2006.01)
(52) U.S. Cl. ...................... 714/718; 365/201
(58) Field of Classification Search ................ 714/718; 365/201
See application file for complete search history.

(56) References Cited

U.S. PATENT DOCUMENTS

| | | | | |
|---|---|---|---|---|
| 5,253,349 | A | * | 10/1993 | Kreitzer ...................... 712/223 |
| 5,469,443 | A | | 11/1995 | Saxena |
| 5,661,732 | A | | 8/1997 | Lo et al. |
| 6,070,252 | A | | 5/2000 | Xu et al. |
| 6,347,056 | B1 | | 2/2002 | Ledford et al. |
| 6,415,403 | B1 | | 7/2002 | Huang et al. |
| 6,553,527 | B1 | | 4/2003 | Shephard, III |

(Continued)

FOREIGN PATENT DOCUMENTS

EP  0 472 818  4/1992

(Continued)

OTHER PUBLICATIONS

Circular BIST with state skipping, Touba, N.A.; Very Large Scale Integration (VLSI) Systems, IEEE Transactions on vol. 10, Issue 5, Oct. 2002 pp. 668-672.*

(Continued)

*Primary Examiner*—Cynthia Britt
(74) *Attorney, Agent, or Firm*—Klarquist Sparkman, LLP

(57) ABSTRACT

A method of performing a built-in-self-test (BIST) of at least one memory element of a circuit is disclosed. In a specific example, a determination is made during running of a BIST whether one or more algorithms are to be run. If any algorithm is not designated for running, the particular algorithm is skipped and the test moves to other algorithms to be run. A BIST controller is configured to perform a group of test algorithms. Certain algorithms from the group may be checked to see if they are to be run or bypassed. A delay or skip state is desirably interposed following the inclusion of a particular algorithm and prior to the start of a next algorithm. A determination is made during the delay or skip state whether the next algorithm is to be run. The user may also have the option of running all of the algorithms if desired for performance of a particular BIST.

51 Claims, 9 Drawing Sheets

U.S. PATENT DOCUMENTS

| | | | |
|---|---|---|---|
| 6,567,942 | B1 | 5/2003 | Shepard, III |
| 6,651,201 | B1 | 11/2003 | Adams et al. |
| 6,658,611 | B1 | 12/2003 | Jun |
| 6,671,837 | B1 | 12/2003 | Reohr, Jr. et al. |
| 6,671,843 | B1 | 12/2003 | Kebichi et al. |
| 6,760,872 | B2 | 7/2004 | Gupta et al. |
| 6,769,081 | B1 | 7/2004 | Parulkar |
| 6,801,461 | B2 | 10/2004 | Hii et al. |
| 6,834,361 | B2 | 12/2004 | Abbott |
| 6,874,111 | B1 | 3/2005 | Adams et al. |
| 6,950,974 | B1 * | 9/2005 | Wohl et al. .................. 714/733 |
| 7,168,005 | B2 | 1/2007 | Adams et al. |
| 7,181,659 | B2 | 2/2007 | Bravo et al. |
| 7,206,979 | B1 | 4/2007 | Zarrineh et al. |
| 7,216,198 | B2 | 5/2007 | Ito et al. |
| 7,426,668 | B2 | 9/2008 | Mukherjee et al. |
| 7,428,680 | B2 | 9/2008 | Mukherjee et al. |
| 7,434,131 | B2 | 10/2008 | Mukherjee et al. |
| 2003/0167431 | A1 | 9/2003 | Nicolaidis et al. |
| 2004/0123200 | A1 | 6/2004 | Caty et al. |
| 2004/0153885 | A1 * | 8/2004 | Chauvel et al. ............... 714/54 |
| 2004/0158786 | A1 | 8/2004 | Caty et al. |
| 2004/0230395 | A1 | 11/2004 | Basto |
| 2005/0120270 | A1 * | 6/2005 | Anand et al. .................. 714/30 |
| 2005/0172180 | A1 * | 8/2005 | Damodaran et al. ......... 714/723 |
| 2005/0204231 | A1 | 9/2005 | Mukherjee et al. |
| 2006/0146622 | A1 | 7/2006 | Mukherjee et al. |
| 2006/0156133 | A1 | 7/2006 | Mukherjee et al. |
| 2006/0156134 | A1 | 7/2006 | Mukherjee et al. |

FOREIGN PATENT DOCUMENTS

| | | |
|---|---|---|
| EP | 1 388 788 | 2/2004 |
| WO | WO 02/89146 | 11/2002 |

OTHER PUBLICATIONS

A pattern skipping method for weighted random pattern testing, Konemann, B.; European Test Conference, 1993. Proceedings of ETC 93., Third Apr. 19-22, 1993 pp. 418-425.*

Wei-Lun Wang; Kuen-Jong Lee; Jhing-Fa Wang; An on-chip march pattern generator for testing embedded memory cores, Very Large Scale Integration (VLSI) Systems, IEEE Transactions on vol. 9, Issue 5, Oct. 2001 pp. 730-735.*

A pattern skipping method for weighted random pattern testing, Konemann, B.; European Test Conference, 1993. Proceedings of ETC 93., Third Apr. 19-22, 1993 pp. 418-425.*

Zarrineh et al., "Programmable Memory BIST and a New Synthesis Framework", 1999.

Huang et al., "A Programmable BIST Core for Embedded DRAM", IEEE, Jan.-Mar. 1999, pp. 59-70.

Zarrineh et al., "On Programmable Memory Built-In Self Test Architectures", 1999.

Appello et al., "Exploiting Programmable BIST for the Diagnosis of Embedded Memory Cores", IEEE, 2003, pp. 379-385.

Jakobsen et al., "Embedded DRAM Built In Self Test and Methodology for Test Insertion," IEEE 2001, paper 35.1, pp. 975-984.

International Search Report for International Application No. PCT/US05/42029, mailed Jun. 8, 2006.

L. Chen, S. Dey, "DEFUSE: A Deterministic Functional Self-Test Methodology for Processors," *Proc. IEEE VLSI Test Symposium*, pp. 255-262, 2000.

Allen C. Cheng, "Comprehensive Study on Designing Memory BIST: Algorithms, Implementations and Trade-offs," *EECS 579*, University of Michigan, Dec. 16, 2002.

G. Jervan, Z. Peng, R. Ubar, and H. Kruus, "A Hybrid BIST Architecture and its Optimization for SoC Testing," *International Symposium on Quality Electronic Design*, pp. 273-279, 2002.

Chen and Dey, "DEFUSE: A Deterministic Functional Self-Test Methodology for Processors," *Proc. IEEE VLSI Test Symposium*, pp. 255-262 (2000).

Cheng, "Comprehensive Study on Designing Memory BIST: Algorithms, Implementations and Trade-offs," *EECS 579*, University of Michigan, (Dec. 16, 2002).

Jervan et al., "A Hybrid BIST Architecture and its Optimization for SoC Testing," *In International Symposium on Quality Electronic Design*, pp. 273-279 (2002).

European Search Report mailed Mar. 19, 2008, European Patent Application No. EP 05 84 9415, 7 pp.

Official Communication mailed Jun. 9, 2008, European Patent Application No. 05849415.4, 6 pp.

* cited by examiner (a) Concurrent Sequencer (b) Sequential Sequencer (c) Sequential Interleaved Sequencer (d) Collapsed Sequential Sequencer (e) Collapsed Sequential Interleaved Sequencer

TESTING MEMORIES USING ALGORITHM SELECTION

RELATED APPLICATION DATA

This application claims the benefit of U.S. provisional patent application No. 60/548,656, filed Feb. 26, 2004, entitled, "Testing Memories Using Algorithm Selection", by Nilanjan Mukherjee, Joseph C. Rayhawk and Amrendra Kumar, which is hereby incorporated by reference.

BACKGROUND

The technology disclosed therein relates to built-in-self-testing of memory elements of circuits wherein flexibility in the selection of test algorithms applied during a BIST is enhanced and also to circuits containing components for performing such BIST operations.

In one known approach for performing a BIST of a memory, prior to performance of the BIST, a set of algorithms for use in BIST testing are specified. A memory BIST (MBIST) testing tool will create or configure an MBIST controller to perform the specified set of algorithms. The entire set of algorithms being run during the BIST. With this approach, the time required for a BIST test may be unnecessarily increased because algorithms are being run that are not needed to achieve desired test coverage.

It is known in built-in-self-test (BIST) hardware configured for testing memories to perform setup steps during the last step of a given algorithm prior to launching the next algorithm in the series. For example, the next addressing scheme for performance of the next algorithm may be setup at this time. Also, each test or algorithm can be applied to each memory concurrently or sequentially. A sequential interleaved approach is also known where, for example, data is written simultaneously to all memories with one retention test.

It is also known to perform diagnostics testing using one or two registers to store error information. In known approaches, a BIST is run at a BIST clock rate. If an error, e.g., error "x", is detected, it is loaded at the BIST clock rate into an error register along with the address of the error. The error may be unloaded to off-chip automatic test equipment (ATE) or a tester at an ATE clock rate that is much slower than the BIST clock rate. If the error register has not been cleared of the error information when the next error (error "x+1") is detected, the BIST halts. Following the loading of the "error x+1" information, the BIST returns to the start of the first algorithm of the entire set of algorithms of the BIST and restarts. When the location of the error "x+1" is again reached, this error is ignored and testing continues. Previously detected and processed error information (e.g., error "1" through error "x") are also ignored. In some systems a second error register is provided for storage of the error associated information. If a subsequent error (e.g., error "x+2") is detected before space is available in a register for storing the "error x+2" information, the BIST is stopped to allow error register space to be cleared for storage of the subsequent error information. Again, the BIST restarts at the beginning of the first algorithm of the entire set of algorithms of the BIST with the BIST ignoring errors that were previously detected. This increases the time required to perform diagnostics as previously satisfactory algorithms are rerun in many cases to get beyond the algorithms including steps where errors were detected.

Therefore, a need exists for built-in-self-test memory approaches that increase the speed of memory BIST operations.

SUMMARY

In general, the technology disclosed herein relates to methods comprising novel and non-obvious combinations and subcombinations of method acts for performing built-in-self-testing (BIST) of memory elements of a circuit as disclosed herein. In addition, the technology relates to circuits which contain built-in-self-test components configured to perform built-in-self-testing (BIST) of at least one memory element of a circuit in accordance with one or more of the novel and non-obvious method acts disclosed herein and also to circuits containing residual components for performing such BIST operations. Residual components refers to BIST components remaining on the chip with the tested circuit following BIST.

In accordance with one embodiment of a method of performing a BIST of at least one memory element of a circuit, a first testing algorithm is run, a determination is made whether to run a second testing algorithm with the determination being performed during a delay following the running of the first testing algorithm. In addition, the second testing algorithm is run if a determination is made that the second testing algorithm is to be run. In general, the first testing algorithm may be any one algorithm of a set of possible algorithms to be run and the second testing algorithm is another algorithm of the set. This does not preclude additional algorithms outside of the set which are, for example, always run during a BIST operation. However, more desirably, a set of possible algorithms comprises all possible algorithms which are to be run during BIST. Most desirably, the determining act is performed during running of the built-in-self-test of at least one memory element and thus may be deemed on-line or run time algorithm selection.

The delay may be any time interval following the running of the first testing algorithm and prior to the running of the second testing algorithm. Although not required, desirably the delay comprises a skip state. The skip state may have a length which is one cycle of a BIST clock which controls the rate at which the first and second testing algorithms are run. In the event a determination is made to run the second testing algorithm, steps required to set up the second testing algorithm for running may be and desirably are performed during the skip state.

An instruction or control information may be checked during the delay interval or skip state to determine whether to run the second testing algorithm based on the instruction or control information. For example, the control information may comprise a value stored in a shift register at a bit position of the shift register associated with the second testing algorithm. Boundary scan hardware (such as in accordance with JTAG IEEE Std. 1149.1) may be used to load the value into the bit position of the shift register associated with the second testing algorithm.

In examples where multiple testing algorithms are provided, each testing algorithm may include a delay interval or skip state at the start thereof. The terminology skip state is used for convenience to indicate that running of an algorithm associated with the skip state may be skipped (not run). The functionality of what takes place at a skip state is not limited to this functionality and any name may be used to describe such state. Instructions or control information, such as values at a register bit position associated with each respective algorithm, can be checked to determine whether that algorithm is to be run or be skipped. Again, boundary scan hardware may be used to load this information.

The user (e.g., designer of the test or person actually running or controlling the BIST) may provide the instruction or control information designating whether to run particular testing algorithms during a BIST or whether a particular algorithm or algorithms should be bypassed and not run. This user provided instruction or control information may be stored in respective locations of a storage element. Each storage location is associated with a respective algorithm. The instruction or control information stored at the associated location is checked to determine whether the particular algorithm is to be run. Values at bit positions of a shift register (each bit position is desirably associated with a respective algorithm) can be at one value if the algorithm is to run and at another value if the algorithm is not to be run during a BIST. Desirably, a skip state is reached prior to the start of running of each of the testing algorithms. In general, a test or testing algorithm is a sequence of test steps to be performed in testing a memory element. A user may combine plural algorithms into one combined algorithm which may then be a single algorithm.

In accordance with another embodiment of a method, at least one set of testing algorithms for performing a built-in-self-test of at least one memory element may be designated with the designated set excluding at least one testing algorithm that a built-in-self-test controller is capable of performing on the at least one memory element. The built-in-self-test of the at least one memory element may then be performed using the designated set of algorithms. In addition, in accordance with an embodiment, there may be first and second designated sets of algorithms with the first set being designated for running during a first BIST of at least one memory element and a second set being designated for running during a second BIST of at least one memory element. A user may designate the one or more sets of testing elements in this embodiment. A delay is reached prior to running of at least a plurality of the algorithms of the dedicated set of algorithms and prior to reaching at least one excluded testing algorithm. In an illustrated embodiment, the act of determining whether a particular algorithm is in the designated set of algorithms or is excluded being performed is determined during the delay. The delay may comprise a respective skip state associated with each algorithm of the designated set of algorithms and with each of the excluded testing algorithms. The skip state is reached prior to the first step of the running of the associated algorithm.

In accordance with an embodiment, errors may be detected during the running of an algorithm that is in the designated set of algorithms with the address of the error within the memory element being tested being determined. In the event the BIST is stopped to allow processing of error information (e.g., to allow time for error information to be scanned out of a register and storage of error information associated with the last detected error) the BIST desirably returns to the skip state associated with the algorithm that was being run when the last error was detected. If this particular algorithm is other than the first algorithm that was run during the BIST, the BIST does not need to return to and restart at the initial algorithm of the BIST in the event an error is detected. The recurrence of the last error at the address where the last error was detected (as well as previously detected errors) may then be ignored during running of the restarted algorithm.

In accordance with a desirable embodiment, the technology also encompasses circuits containing hardware components, such as a built-in-self-test controller and algorithm selection components in accordance with one or more of the novel combinations of method acts described herein. The technology also encompasses circuits following such BIST testing that have residual components used in performing the testing.

These and other novel and non-obvious advantages and features of the technology will become more apparent with reference to the description and drawings referenced below.

DETAILED DESCRIPTION

Figure 1:
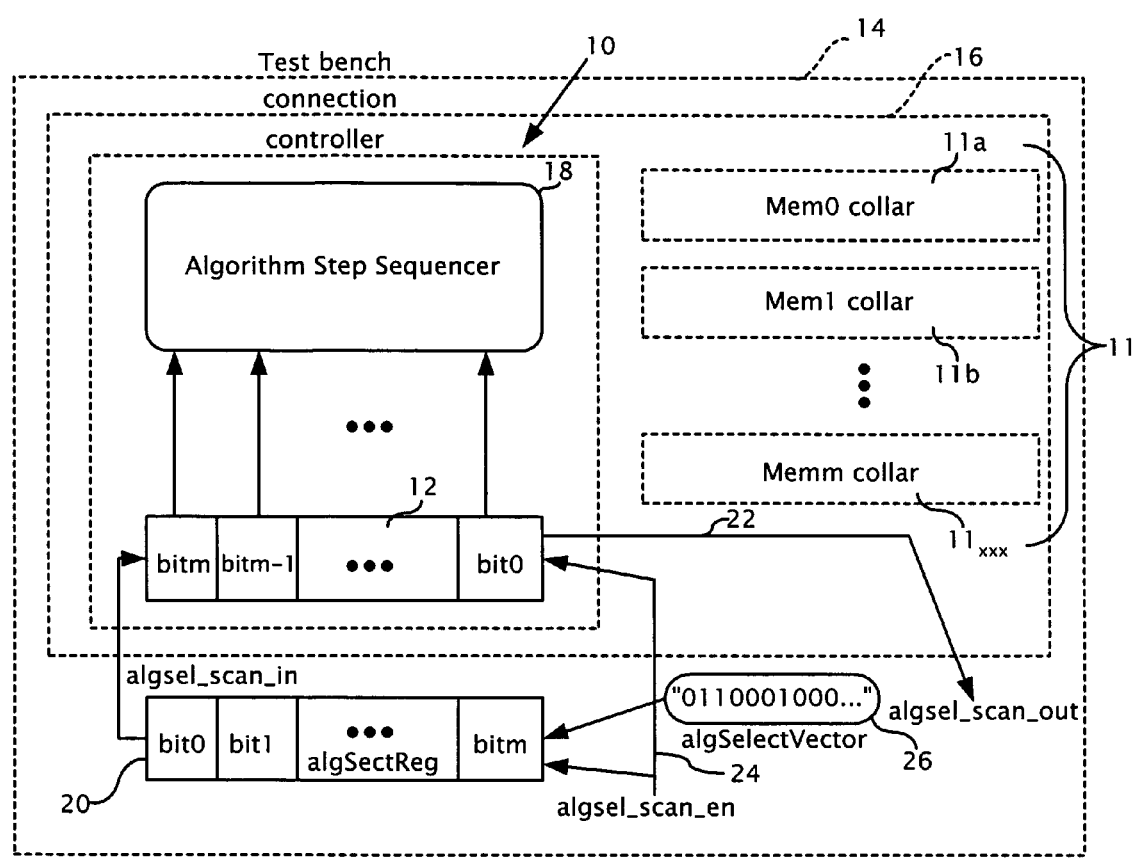
FIG. 1 shows a block diagram of an exemplary BIST controller with one form of algorithm selector hardware, in this embodiment comprising an algorithm selection register.

Disclosed below are representative embodiments of methods and apparatus for testing memories in an integrated circuit or other digital device. The disclosed methods may be used in connection with built-in-self-test (BIST) hardware configured to test one or more memories (collectively referred to as "memory BIST" or "MBIST") or with external test equipment (e.g., an external tester configured to generate, select, and apply the relevant test algorithms to the memories).

The disclosed methods and apparatus should not be construed as limiting in any way. Instead, the present disclosure is directed toward novel and non-obvious features and aspects of the various disclosed embodiments, alone and in various combinations and subcombinations with one another. Moreover, the methods and apparatus are not limited to any specific aspect or feature, or combinations thereof, nor do the disclosed methods and apparatus require that any one or more specific advantages be present or problems be solved.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

For purposes of this disclosure, the word "including" has the same broad meaning as the word "comprising". In addition, words such as "a" and "an", unless otherwise indicated to the contrary, include the plural as well as the singular. Thus, for example, the requirement of "a feature" is satisfied where one or more of these features are present. In addition, the term "or" includes the conjunctive, the disjunctive and both (a or b thus includes either a or b, as well as a and b).

The disclosed embodiments can be implemented in a wide variety of integrated circuits or digital devices (e.g., systems-on-a-chip (SoCs), application-specific integrated circuits (ASICs), or programmable logic devices (PLDs) such as field programmable gate arrays (FPGAs)) that have one or more embedded memories (e.g., static RAMs (SRAMs), dynamic RAMs (DRAMs), content addressable memories (CAMs) or other such memory devices) or that are otherwise coupled to one or more memories. The disclosed methods and apparatus, for instance, can be used to test multiple memories embedded in an integrated circuit (e.g., one MBIST controller can be used to test multiple embedded memories on a chip). The disclosed methods and apparatus can also be used in connection with known MBIST architectures and systems. For example, one such MBIST architecture is described in U.S. Published Patent Application No. 20020059543, which is incorporated by reference herein.

Any of the apparatus described herein can be designed, verified, simulated, and/or synthesized using software comprising computer-executable instructions stored on a computer-readable medium. Such software can comprise, for example, an electronic-design-automation (EDA) software tool, such as a design, verification, simulation, and/or synthesis tool. One such exemplary tool is MBISTArchitect® available from Mentor Graphics Corporation. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail except to note that computers typically have at least one computer processing unit, memory, a visual display such as a screen or monitor and an input device, such as a keyboard and a mouse.

Further, any of the disclosed apparatus (or apparatus designed by the disclosed methods) can be stored as circuit design information that is stored on a computer-readable medium. The circuit design information can be included in a design database that is updated or modified (e.g., on a single computer or via a network). Accordingly, updated or modified design databases storing circuit design information for any of the disclosed apparatus are also considered to be within the scope of this disclosure.

Any of the memory-testing schemes described herein can be run at various times or phases during the manufacturing process, or in the field after production. For example, any of the disclosed algorithm selection processes may be used by a manufacturer to test embedded memories at a pre-packaging stage of manufacture (e.g., a wafer test) or at a post-packaging stage of manufacture (e.g., a package test).

Some of the features of the disclosed technology are described below as being implemented as part of the MBISTArchitect® tool. This particular software implementation should not be construed as limiting in any way, as the principles disclosed herein are generally applicable to other EDA software tools used to design, verify, and synthesize embedded memory testing hardware.

I. The Algorithm Selection Framework in General

One of the nonlimiting features of the disclosed technology is to provide the user the ability to select and run all or a subset of memory-algorithms that are implemented in a particular MBIST controller. This algorithm selection process can be performed online (e.g., in the field) by accessing the MBIST controller through, for example, input/output pins of the chip or using boundary scan (e.g., JTAG IEEE Std. 1149.1) hardware.

One exemplary method for implementing the on-line algorithm selection hardware comprises the following nonlimiting acts, which may be performed using an appropriate EDA MBIST software tool.

1. The user adds all memory models for which the controller is generated.

2. The user, optionally, specifies all algorithms to be applied. (According to one implementation, if none are specified, a default algorithm can be used (e.g., march2). Testing algorithms are known and comprise a sequence of testing steps that are performed to complete the testing of a memory element in accordance with the algorithm. This disclosure is not limited to the use of any one or more specific algorithms now known or hereafter developed.

3. An option may be provided which allows the user to specify whether runtime or on-line selection of algorithms that are to be applied during a BIST is to be implemented. For example, using some command, (e.g., "SETup ALgorithm Selection"), the user decides whether he or she wishes to add support for runtime algorithm selection. By keeping the algorithm selection OFF, the user maintains the current behavior of the EDA tool, and no additional hardware is added to implement runtime algorithm selection. On the other hand, by turning algorithm selection ON, the MBIST tool is instructed to add additional hardware to allow runtime algorithm selection. The words ON and OFF simply represent a decision which could be represented in any other way (such as two logic values '0' and '1'). As more fully explained below, the user may, in some embodiments, include additional commands that help set the test bench and the reset state of an algorithm selector such as an algorithm selection register.

4. The user can optionally see if algorithm selection is turned ON or OFF. The user can desirably also see which algorithms are selected to run. This can be done, for example, using a report command.

5. The user, optionally, specifies other controller parameters as is common in memory BIST applications.

6. The user runs the BIST generation, and saves the generated RTL (the disclosure is not limited to RTL).

FIG. 1 shows a block diagram of an exemplary MBIST controller 10 comprising the newly added interface signals for on-line algorithm selection, the added hardware (at the block level), and their connections to the algorithm step sequencer. The MBIST controller is used in testing memory elements, such as indicated by numbers 11a, 11b and 11xxx and collectively indicated at 11 in FIG. 1. Any number of memory elements may be used. The MBIST controller 10 is on the same chip or device as the memory elements of the circuit being tested in the embodiment. The added hardware (here, an algorithm selection storage device such as an algorithm selection register 12) illustrates only one particular way in which the desired algorithm-selection functionality can be obtained. Other types of registers or configurations of memory devices, such as flip-flops or latches, may be used. Also, instead of a register of length n (corresponding to n algorithms) that could be loaded with a binary vector to select the algorithms that a user wants to run, there are other additional ways of doing the same. One such way, for example, is to have n primary input pins that could be controlled directly from the tester to specify the vector for algorithm selection. In this case, there is no need to store the algorithm selection information on-chip but the controller may monitor those primary inputs in order to determine if an algorithm needs to be skipped or not. In this case, the selected algorithm information may be stored at a location off the chip or device containing the memory elements being tested.

According to one embodiment, such as FIG. 1, the generated BIST controller 10 will have the necessary hardware to run any combination of algorithms or none of the algorithms. The generated testbench 14 will run only the algorithms specified. The newly added interface signals to the controller can be brought up in the connection module interface 16. The test time can be updated to reflect the new delay time intervals, such as skip states (discussed below) that are added to the controller algorithm step sequencer 18. Finally, according to one implementation, an optional report algorithm step command will now reflect the newly added delay intervals or skip states of the sequencer.

Figure 5:
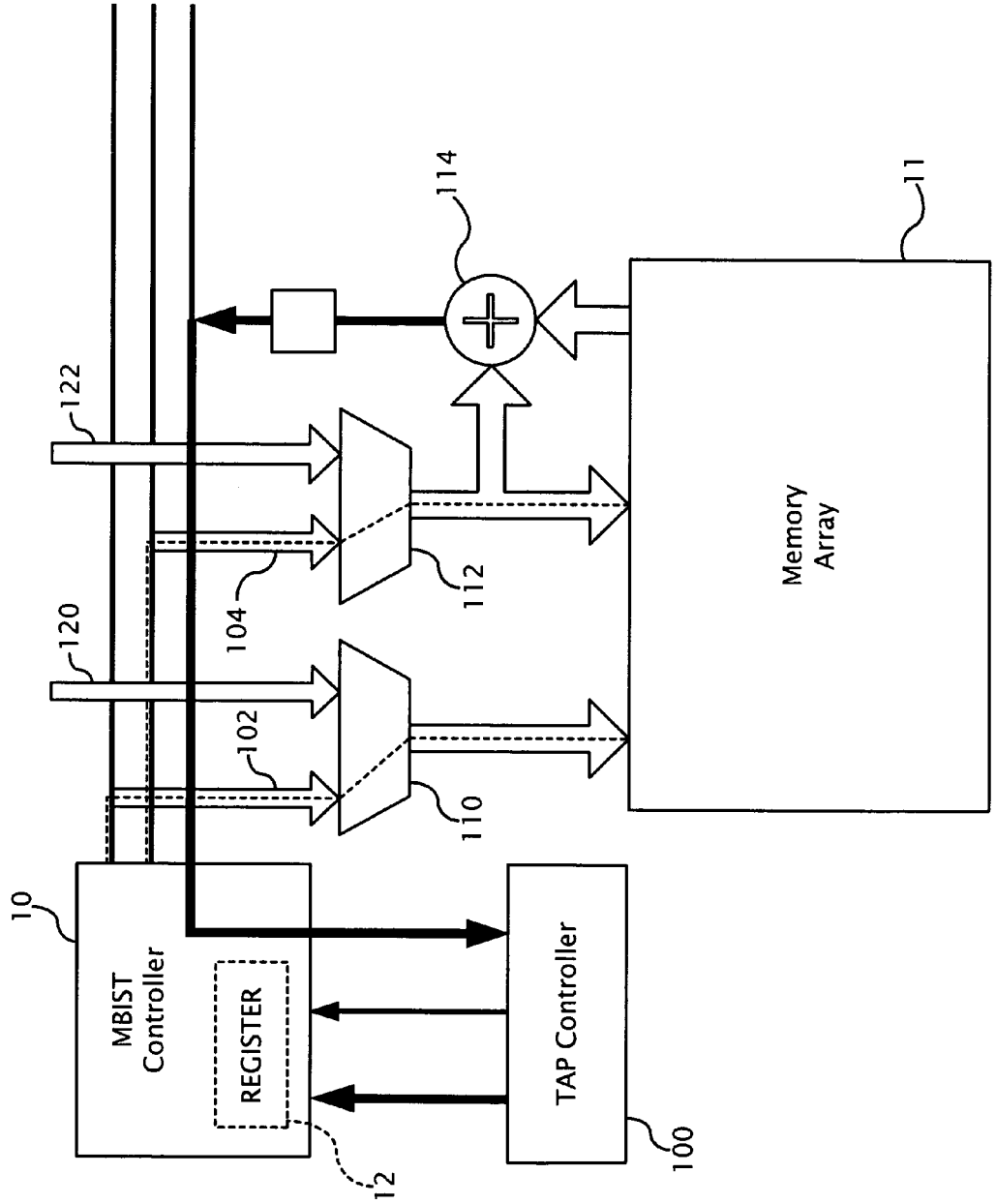
FIG. 5 is a block diagram showing an exemplary memory built-in-self-test controller coupled to a memory-under test.

FIG. 5 illustrates a block diagram operating during a BIST of a memory array containing plural memory elements. During a BIST, assume algorithm selection register 10 indicates at a skip state that a particular algorithm is to be run simultaneously at two memory elements (this is a simplified example). Algorithm parameters are loaded by tap controller 100 into the BIST controller 10 (MBIST 10) and the BIST controller executes the test via paths 102, 104 through respective MUXes 110, 112 and to memory array 11. The paths for the test data are indicated by dashed lines in FIG. 5. The test results (via XOR 114) are read by the TAP controller. During the BIST, system data, via lines 120, 122, is not being delivered to the memory array 11.

In one embodiment, the user can optionally decide to choose a separate clock for loading the algorithm selection register. This clock can be specified, for example, by using a new switch (e.g., "-algsel_clk" in "SETup MEmory Clock").

With reference to the exemplary embodiment shown in FIG. 1, a number of new interface signals may be added to the MBIST controller interface. These signals comprise:

1. The "algsel_scan_in" signal 20, which comprises the scan input of the exemplary algorithm selection shift register 12 added to the MBIST controller 10. In the illustrated embodiment, the first bit shifted is for the first algorithm run by the sequencer and the last bit shifted is for the last algorithm run by the sequencer, though this ordering is not limiting in any way and may be rearranged without departing from the principles of the disclosed technology.

2. The "algsel_scan_out" signal 22 comprises the scan output of the algorithm selection shift register 12. In the illustrated embodiment, the register 12 shifts out a single bit for each shift-in operation. Further, in FIG. 1 the shifted value is bit zero of the shift register, though this ordering is not limited.

3. The "algsel_scan_en" signal 24 comprises the scan enable signal for the algorithm selection shift register 12. Before the BIST run is started, this pin is asserted and the desired algorithms to run are shifted. The pin is then deasserted. Notice that the number of bits shifted in reflects the number of algorithms implemented. In the illustrated embodiment, a "1" is shifted for an algorithm that will run, whereas a "0" is shifted for an algorithm that will be skipped. An exemplary algorithm selection vector (algSelectVector) is indicated at 26 in FIG. 1. The shift is desirably performed (i.e., algsel_scan_en 24 is asserted) only while test_h is not asserted (i.e., before the test start), and while reset is inactive.

4. The "algsel_scan_clk" signal (not shown in FIG. 1) is the clock of the algorithm selection shift register 12. In some embodiments, this clock pin is not created by default, and the user may have to specify whether a separate clock is needed to load the algorithm selection register.

The pin names listed above are not limiting in any way and may be altered by a user or software manufacturer depending on the implementation. Further, not all of the pins are always necessary. Table 1 summarizes the new signals discussed above in the exemplary embodiment illustrated in FIG. 1:

TABLE 1

| Interface Signals of the Exemplary Embodiment of FIG. 1 | | | |
| --- | --- | --- | --- |
| Name | Direction | Width | Notes |
| algsel_scan_in | Input | 1 | Scan Input |
| algsel_scan_en | Input | 1 | Scan enable |
| algsel_scan_out | Output | 1 | Scan Output |
| algsel_scan_clk | Input | 1 | Clock. |

FIGS. 2(a)-2(e) comprise block diagrams illustrating some of the various methods of applying memory test algorithms. The MBIST controller can be configured to apply the memory test algorithms according to one or more of these illustrated methods. In particular, FIG. 2(a) illustrates a concurrent sequencer, FIG. 2(b) illustrates a sequential non-interleaved sequencer, FIG. 2(c) illustrates a sequential interleaved sequencer, FIG. 2(d) illustrates a collapsed sequential non-interleaved sequencer, and FIG. 2(e) illustrates a collapsed sequential interleaved sequencer.

FIGS. 2(d) and 2(e) are extensions of FIGS. 2(b) and 2(c) respectively. For many test situations, it is possible to reduce the apparent number of states, or algorithm steps, and introduce a separate signal which controls which memory is being tested. For example, suppose an algorithm consists of k tstates (i.e., the algorithm step register variable). If you have n memories that have to be tested sequentially—then you would need n×k tstates, which may be very high. However, instead of creating new tstates when the same algorithm is applied to every memory, the same tstates may be used for the algorithm and repeated for every memory that is tested sequentially. When suitable, this collapsing process leads to controllers that use much less area and can operate at higher clock frequencies.

FIGS. 2(d) and 2(e) show exemplary implementations for applications using the collapsing technique.

It should be noted that the algorithms can be of any length and thus the fact that each ends in step k is simply for convenience as k represents the number of steps in a particular algorithm and thus may vary from algorithm to algorithm. In the same manner, m is used simply as a convenient way of designating algorithms that are performed and represents any number of algorithms that are being performed in a particular operation and can vary, e.g., from BIST to BIST and within a BIST.

Figure 7:
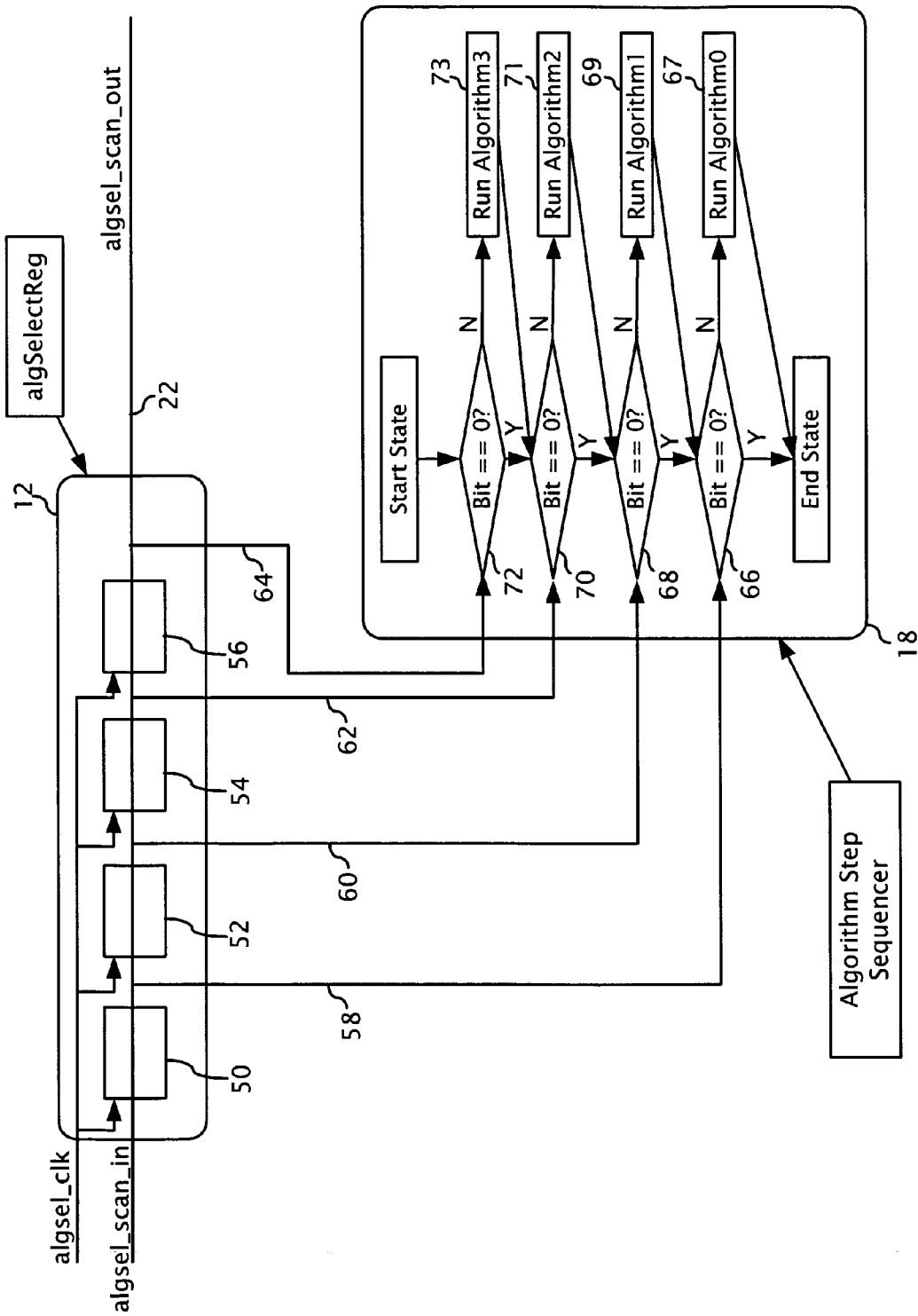
FIG. 7 is a block diagram illustrating an exemplary algorithm step sequencer for determining whether particular algorithms are to run and for running the algorithms if they are to be run.

Of note is the "skip" or "skip state" step that is included between successive memory test algorithms. During this skip step, a determination is made as to whether the next successive memory test algorithm should be applied or skipped (as illustrated by the line at the left of the skip step that extends to the next respective skip state). This determination can be made, for example, using the values loaded and stored in an algorithm selection register 12 (such as the one illustrated in FIG. 1) or using some other method (e.g., checking the values at one or more input/output pins or using algorithm selection values stored elsewhere on the integrated circuit). In the exemplary embodiment illustrated in FIG. 1, for example, the algorithm selection register 12 comprises m memory elements (e.g., flip-flops), where m is the number of test algorithms the MBIST controller is configured to generate. Thus, each memory element corresponds to a respective test algorithm and can be used to store a value indicative of whether the test algorithm should be applied (e.g., a "1" if the algorithm is to be applied and a "0" if not). These values can then be input into the MBIST controller during the appropriate skip step (in parallel, as shown, or in series), thereby controlling whether a particular algorithm is applied or skipped. This procedure is illustrated in FIG. 7 for a simplified example where four algorithms are in the set of possible algorithms for selection to run. In FIG. 7, there are four flip-flops 50,52,54, 56 with respective outputs 58,60,62 and 64. The values at the outputs are checked by the state sequencer where a decision is made, based on the value, whether to run the algorithm that corresponds to the associated flip-flop and bit position. Thus, if the bit value on line 58 is '1' (not zero) at block 66, the no branch is followed and algorithm 0 is run at block 67. Similarly, at blocks 68,70 and 72, the bit values on respective lines 60,62 and 64 are checked and a decision of whether to run the associated algorithm is indicated at respective blocks 69,71 and 73. If the bit value on the associated line is '0' (e.g., for line 60), the yes branch from associated block (e.g., block 68) is followed and the associated algorithm (e.g., Algorithm 1) is by passed and not run.

In one embodiment, the initial setup for the next algorithm to be run is performed during the skip state. For example, any of the techniques described in U.S. Published Patent Application No. 20020059543 or performed in the an MBIST software tool at the last step of the previous algorithm can be delayed so that they are performed during the skip state.

Exemplary listings generated by an optional, but desirable "report algorithm" step are shown below for a concurrent controller, a sequential controller, and a sequential-interleaved controller. The exemplary listings illustrate how the skip states can be inserted between the algorithms. The exemplary listings assume that the controllers are configured to apply three memory test algorithms (march1, march2, and march3) to five embedded memories. The particular number of algorithms and of memories is for illustrative purposes only and should be not be construed as limiting in any way. Indeed, any test algorithm (in combination with any data background) can be used in connection with the disclosed architecture and algorithm selection method. For example, in some embodiments, user-defined algorithms are applied by the MBIST controller either alone or in combination with conventional test algorithms (e.g., March algorithms). Further, skip states need not be inserted between every algorithm to be applied. For example, in some embodiments, skip states may be implemented between only some or a portion of the algorithms.

Listing 1: Concurrent controller
// command: report algorithm steps

| Clock Cycles | | |
|---|---|---|
| Cumulative | Incremental | Step |
| 1 | 1 | start_state |
| 2 | 1 | skip_state_0 |
| 50 | 48 | march1/march1/wSeedUp |
| 146 | 96 | march1/march1/rwInvSeedUp |
| 242 | 96 | march1/march1/rwSeedUp |
| 338 | 96 | march1/march1/rwInvSeedDown |
| 434 | 96 | march1/march1/rwSeedDown |
| 482 | 48 | march1/march1/rSeedDown |
| 483 | 1 | skip_state_1 |
| 531 | 48 | march2/march2/wBackgroundUp |
| 675 | 144 | march2/march2/rwrInvBackgroundUp |
| 819 | 144 | march2/march2/rwrBackgroundUp |
| 963 | 144 | march2/march2/rwrInvBackgroundDown |
| 1107 | 144 | march2/march2/rwrBackgroundDown |
| 1155 | 48 | march2/march2/rBackgroundDown |
| 1156 | 1 | skip_state_2 |
| 1204 | 48 | march3/march3/wBackgroundUp |
| 1348 | 144 | march3/march3/rwrInvBackgroundUp |
| 1492 | 144 | march3/march3/rwrBackgroundUp |
| 1636 | 144 | march3/march3/rwrInvBackgroundDown |
| 1637 | 1 | complete_state |

Listing 2: Sequential controller
// command: report algorithm steps

| Clock Cycles | | |
|---|---|---|
| Cumulative | Incremental | Memory Step |
| 1 | 1 | start_state |
| 2 | 1 | skip_state_0 |
| 50 | 48 | 0 march1/march1/wSeedUp |
| 146 | 96 | 0 march1/march1/rwInvSeedUp |
| 242 | 96 | 0 march1/march1/rwSeedUp |
| 338 | 96 | 0 march1/march1/rwInvSeedDown |
| 434 | 96 | 0 march1/march1/rwSeedDown |
| 482 | 48 | 0 march1/march1/rSeedDown |
| 483 | 1 | skip_state_1 |
| 531 | 48 | 0 march2/march2/wBackgroundUp |
| 675 | 144 | 0 march2/march2/rwrInvBackgroundUp |
| 819 | 144 | 0 march2/march2/rwrBackgroundUp |
| 963 | 144 | 0 march2/march2/rwrInvBackgroundDown |
| 1107 | 144 | 0 march2/march2/rwrBackgroundDown |
| 1155 | 48 | 0 march2/march2/rBackgroundDown |
| 1156 | 1 | skip_state_2 |
| 1204 | 48 | 0 march3/march3/wBackgroundUp |
| 1348 | 144 | 0 march3/march3/rwrInvBackgroundUp |
| 1492 | 144 | 0 march3/march3/rwrBackgroundUp |
| 1636 | 144 | 0 march3/march3/rwrInvBackgroundDown |
| 1637 | 1 | skip_state_0 |
| 1670 | 33 | 1 march1/march1/wSeedUp |
| 1734 | 64 | 1 march1/march1/rwInvSeedUp |
| 1798 | 64 | 1 march1/march1/rwSeedUp |
| 1862 | 64 | 1 march1/march1/rwInvSeedDown |
| 1926 | 64 | 1 march1/march1/rwSeedDown |
| 1958 | 32 | 1 march1/march1/rSeedDown |
| 1959 | 1 | skip_state_1 |
| 1992 | 33 | 1 march2/march2/wBackgroundUp |
| 2088 | 96 | 1 march2/march2/rwrInvBackgroundUp |
| 2184 | 96 | 1 march2/march2/rwrBackgroundUp |
| 2280 | 96 | 1 march2/march2/rwrInvBackgroundDown |
| 2376 | 96 | 1 march2/march2/rwrBackgroundDown |
| 2408 | 32 | 1 march2/march2/rBackgroundDown |
| 2409 | 1 | skip_state_2 |
| 2442 | 33 | 1 march3/march3/wBackgroundUp |
| 2538 | 96 | 1 march3/march3/rwrInvBackgroundUp |
| 2634 | 96 | 1 march3/march3/rwrBackgroundUp |
| 2730 | 96 | 1 march3/march3/rwrInvBackgroundDown |
| 2731 | 1 | skip_state_0 |
| 2780 | 49 | 2 march1/march1/wSeedUp |
| 2876 | 96 | 2 march1/march1/rwInvSeedUp |
| 2972 | 96 | 2 march1/march1/rwSeedUp |
| 3068 | 96 | 2 march1/march1/rwInvSeedDown |
| 3164 | 96 | 2 march1/march1/rwSeedDown |
| 3212 | 48 | 2 march1/march1/rSeedDown |
| 3213 | 1 | skip_state_1 |
| 3262 | 49 | 2 march2/march2/wBackgroundUp |
| 3406 | 144 | 2 march2/march2/rwrInvBackgroundUp |
| 3550 | 144 | 2 march2/march2/rwrBackgroundUp |
| 3694 | 144 | 2 march2/march2/rwrInvBackgroundDown |
| 3838 | 144 | 2 march2/march2/rwrBackgroundDown |
| 3886 | 48 | 2 march2/march2/rBackgroundDown |
| 3887 | 1 | skip_state_2 |
| 3936 | 49 | 2 march3/march3/wBackgroundUp |

-continued

| | | |
|---|---|---|
| 4080 | 144 | 2 march3/march3/rwrInvBackgroundUp |
| 4224 | 144 | 2 march3/march3/rwrBackgroundUp |
| 4368 | 144 | 2 march3/march3/rwrInvBackgroundDown |
| 4369 | 1 | skip_state_0 |
| 4390 | 21 | 3 march1/march1/wSeedUp |
| 4430 | 40 | 3 march1/march1/rwInvSeedUp |
| 4470 | 40 | 3 march1/march1/rwSeedUp |
| 4510 | 40 | 3 march1/march1/rwInvSeedDown |
| 4550 | 40 | 3 march1/march1/rwSeedDown |
| 4570 | 20 | 3 march1/march1/rSeedDown |
| 4571 | 1 | skip_state_1 |
| 4592 | 21 | 3 march2/march2/wBackgroundUp |
| 4652 | 60 | 3 march2/march2/rwrInvBackgroundUp |
| 4712 | 60 | 3 march2/march2/rwrBackgroundUp |
| 4772 | 60 | 3 march2/march2/rwrInvBackgroundDown |
| 4832 | 60 | 3 march2/march2/rwrBackgroundDown |
| 4852 | 20 | 3 march2/march2/rBackgroundDown |
| 4853 | 1 | skip_state_2 |
| 4874 | 21 | 3 march3/march3/wBackgroundUp |
| 4934 | 60 | 3 march3/march3/rwrInvBackgroundUp |
| 4994 | 60 | 3 march3/march3/rwrBackgroundUp |
| 5054 | 60 | 3 march3/march3/rwrInvBackgroundDown |
| 5055 | 1 | skip_state_0 |
| 5068 | 13 | 4 march1/march1/wSeedUp |
| 5092 | 24 | 4 march1/march1/rwInvSeedUp |
| 5116 | 24 | 4 march1/march1/rwSeedUp |
| 5140 | 24 | 4 march1/march1/rwInvSeedDown |
| 5164 | 24 | 4 march1/march1/rwSeedDown |
| 5176 | 12 | 4 march1/march1/rSeedDown |
| 5177 | 1 | skip_state_1 |
| 5190 | 13 | 4 march2/march2/wBackgroundUp |
| 5226 | 36 | 4 march2/march2/rwrInvBackgroundUp |
| 5262 | 36 | 4 march2/march2/rwrBackgroundUp |
| 5298 | 36 | 4 march2/march2/rwrInvBackgroundDown |
| 5334 | 36 | 4 march2/march2/rwrBackgroundDown |
| 5346 | 12 | 4 march2/march2/rBackgroundDown |
| 5347 | 1 | skip_state_2 |
| 5360 | 13 | 4 march3/march3/wBackgroundUp |
| 5396 | 36 | 4 march3/march3/rwrInvBackgroundUp |
| 5432 | 36 | 4 march3/march3/rwrBackgroundUp |
| 5468 | 36 | 4 march3/march3/rwrInvBackgroundDown |
| 5469 | 1 | skip_state_0 |
| 5518 | 49 | 5 march1/march1/wSeedUp |
| 5614 | 96 | 5 march1/march1/rwInvSeedUp |
| 5710 | 96 | 5 march1/march1/rwSeedUp |
| 5806 | 96 | 5 march1/march1/rwInvSeedDown |
| 5902 | 96 | 5 march1/march1/rwSeedDown |
| 5950 | 48 | 5 march1/march1/rSeedDown |
| 5951 | 1 | skip_state_1 |
| 6000 | 49 | 5 march2/march2/wBackgroundUp |
| 6144 | 144 | 5 march2/march2/rwrInvBackgroundUp |
| 6288 | 144 | 5 march2/march2/rwrBackgroundUp |
| 6432 | 144 | 5 march2/march2/rwrInvBackgroundDown |
| 6576 | 144 | 5 march2/march2/rwrBackgroundDown |
| 6624 | 48 | 5 march2/march2/rBackgroundDown |
| 6625 | 1 | skip_state_2 |
| 6674 | 49 | 5 march3/march3/wBackgroundUp |
| 6818 | 144 | 5 march3/march3/rwrInvBackgroundUp |
| 6962 | 144 | 5 march3/march3/rwrBackgroundUp |
| 7106 | 144 | 5 march3/march3/rwrInvBackgroundDown |
| 7107 | 1 | complete_state |

Listing 3: Sequential-Interleaved controller
// command: report algorithm steps

| | | |
|---|---|---|
| 1 | 1 | start_state |
| 2 | 1 | skip_state_0 |
| 50 | 48 | 0 march1/march1/wSeedUp |
| 82 | 32 | 1 march1/march1/wSeedUp |
| 130 | 48 | 2 march1/march1/wSeedUp |
| 150 | 20 | 3 march1/march1/wSeedUp |
| 162 | 12 | 4 march1/march1/wSeedUp |
| 210 | 48 | 5 march1/march1/wSeedUp |
| 306 | 96 | 0 march1/march1/rwInvSeedUp |
| 370 | 64 | 1 march1/march1/rwInvSeedUp |
| 466 | 96 | 2 march1/march1/rwInvSeedUp |
| 506 | 40 | 3 march1/march1/rwInvSeedUp |
| 530 | 24 | 4 march1/march1/rwInvSeedUp |
| 626 | 96 | 5 march1/march1/rwInvSeedUp |
| 722 | 96 | 0 march1/march1/rwSeedUp |
| 786 | 64 | 1 march1/march1/rwSeedUp |
| 882 | 96 | 2 march1/march1/rwSeedUp |
| 922 | 40 | 3 march1/march1/rwSeedUp |
| 946 | 24 | 4 march1/march1/rwSeedUp |
| 1042 | 96 | 5 march1/march1/rwSeedUp |
| 1138 | 96 | 0 march1/march1/rwInvSeedDown |
| 1202 | 64 | 1 march1/march1/rwInvSeedDown |
| 1298 | 96 | 2 march1/march1/rwInvSeedDown |
| 1338 | 40 | 3 march1/march1/rwInvSeedDown |
| 1362 | 24 | 4 march1/march1/rwInvSeedDown |
| 1458 | 96 | 5 march1/march1/rwInvSeedDown |
| 1554 | 96 | 0 march1/march1/rwSeedDown |
| 1618 | 64 | 1 march1/march1/rwSeedDown |
| 1714 | 96 | 2 march1/march1/rwSeedDown |
| 1754 | 40 | 3 march1/march1/rwSeedDown |
| 1778 | 24 | 4 march1/march1/rwSeedDown |
| 1874 | 96 | 5 march1/march1/rwSeedDown |
| 1922 | 48 | 0 march1/march1/rSeedDown |
| 1954 | 32 | 1 march1/march1/rSeedDown |
| 2002 | 48 | 2 march1/march1/rSeedDown |
| 2022 | 20 | 3 march1/march1/rSeedDown |
| 2034 | 12 | 4 march1/march1/rSeedDown |
| 2082 | 48 | 5 march1/march1/rSeedDown |
| 2083 | 1 | skip_state_1 |
| 2131 | 48 | 0 march2/march2/wBackgroundUp |
| 2163 | 32 | 1 march2/march2/wBackgroundUp |
| 2211 | 48 | 2 march2/march2/wBackgroundUp |
| 2231 | 20 | 3 march2/march2/wBackgroundUp |
| 2243 | 12 | 4 march2/march2/wBackgroundUp |
| 2291 | 48 | 5 march2/march2/wBackgroundUp |
| 2435 | 144 | 0 march2/march2/rwrInvBackgroundUp |
| 2531 | 96 | 1 march2/march2/rwrInvBackgroundUp |
| 2675 | 144 | 2 march2/march2/rwrInvBackgroundUp |
| 2735 | 60 | 3 march2/march2/rwrInvBackgroundUp |
| 2771 | 36 | 4 march2/march2/rwrInvBackgroundUp |
| 2915 | 144 | 5 march2/march2/rwrInvBackgroundUp |
| 3059 | 144 | 0 march2/march2/rwrBackgroundUp |
| 3155 | 96 | 1 march2/march2/rwrBackgroundUp |
| 3299 | 144 | 2 march2/march2/rwrBackgroundUp |
| 3359 | 60 | 3 march2/march2/rwrBackgroundUp |
| 3395 | 36 | 4 march2/march2/rwrBackgroundUp |
| 3539 | 144 | 5 march2/march2/rwrBackgroundUp |
| 3683 | 144 | 0 march2/march2/rwrInvBackgroundDown |
| 3779 | 96 | 1 march2/march2/rwrInvBackgroundDown |
| 3923 | 144 | 2 march2/march2/rwrInvBackgroundDown |
| 3983 | 60 | 3 march2/march2/rwrInvBackgroundDown |
| 4019 | 36 | 4 march2/march2/rwrInvBackgroundDown |
| 4163 | 144 | 5 march2/march2/rwrInvBackgroundDown |
| 4307 | 144 | 0 march2/march2/rwrBackgroundDown |
| 4403 | 96 | 1 march2/march2/rwrBackgroundDown |
| 4547 | 144 | 2 march2/march2/rwrBackgroundDown |
| 4607 | 60 | 3 march2/march2/rwrBackgroundDown |
| 4643 | 36 | 4 march2/march2/rwrBackgroundDown |
| 4787 | 144 | 5 march2/march2/rwrBackgroundDown |
| 4835 | 48 | 0 march2/march2/rBackgroundDown |
| 4867 | 32 | 1 march2/march2/rBackgroundDown |
| 4915 | 48 | 2 march2/march2/rBackgroundDown |
| 4935 | 20 | 3 march2/march2/rBackgroundDown |
| 4947 | 12 | 4 march2/march2/rBackgroundDown |
| 4995 | 48 | 5 march2/march2/rBackgroundDown |
| 4996 | 1 | skip_state_2 |
| 5044 | 48 | 0 march3/march3/wBackgroundUp |
| 5076 | 32 | 1 march3/march3/wBackgroundUp |
| 5124 | 48 | 2 march3/march3/wBackgroundUp |
| 5144 | 20 | 3 march3/march3/wBackgroundUp |
| 5156 | 12 | 4 march3/march3/wBackgroundUp |
| 5204 | 48 | 5 march3/march3/wBackgroundUp |
| 5348 | 144 | 0 march3/march3/rwrInvBackgroundUp |
| 5444 | 96 | 1 march3/march3/rwrInvBackgroundUp |
| 5588 | 144 | 2 march3/march3/rwrInvBackgroundUp |
| 5648 | 60 | 3 march3/march3/rwrInvBackgroundUp |
| 5684 | 36 | 4 march3/march3/rwrInvBackgroundUp |
| 5828 | 144 | 5 march3/march3/rwrInvBackgroundUp |
| 5972 | 144 | 0 march3/march3/rwrBackgroundUp |
| 6068 | 96 | 1 march3/march3/rwrBackgroundUp |
| 6212 | 144 | 2 march3/march3/rwrBackgroundUp |
| 6272 | 60 | 3 march3/march3/rwrBackgroundUp |
| 6308 | 36 | 4 march3/march3/rwrBackgroundUp |
| 6452 | 144 | 5 march3/march3/rwrBackgroundUp |

-continued

| | | |
|---|---|---|
| 6596 | 144 | 0 march3/march3/rwrInvBackgroundDown |
| 6692 | 96 | 1 march3/march3/rwrInvBackgroundDown |
| 6836 | 144 | 2 march3/march3/rwrInvBackgroundDown |
| 6896 | 60 | 3 march3/march3/rwrInvBackgroundDown |
| 6932 | 36 | 4 march3/march3/rwrInvBackgroundDown |
| 7076 | 144 | 5 march3/march3/rwrInvBackgroundDown |
| 7077 | 1 | complete_state |

II. On-line Algorithm Selection Commands

As noted above, new commands may be needed in the relevant EDA software tool that enable/disable the on-line algorithm selection mechanism. Desirably, the command syntax should allow for the specification of the algorithm(s) to be selected or skipped. Desirably, when algorithm selection is disabled, no extra hardware or test time should be incurred. The commands and/or the algorithms selected may be input by a user using a traditional command-driven interface, an exemplary version of which is discussed below, or using a graphical-user interface.

In one particular embodiment that is implemented in an MBIST tool environment, a new command (e.g., "SETup ALgorithm Selection") is implemented to enable/disable on-line algorithm selection. When enabled, the user can specify the algorithm(s) to run. According to this implementation, specifying an algorithm(s) only changes the run status of the algorithm. That is, algorithm selection/skipping is not hard-wired in this example and one or more bits are typically used to select each algorithm during a corresponding skip state that is inserted between algorithms in the sequencer.

The user can optionally check which algorithms are selected such as by using a report command (e.g., "REPort MBIST Algorithms"). In one exemplary implementation, the command results in listing out of the names of the algorithms, as well as information about which algorithms are selected for online algorithm selection. For example, if algorithm selection is "off" (e.g., not enabled), the report may only have one column for the name of algorithms. If algorithm selection is turned "on" (e.g., enabled), the report desirably has another column to display which algorithms are selected.

The user can optionally have a separate clock for the online algorithm selection register, if one is used. The name for this clock can be specified, for example, using a new switch in the command "SETup MEmory Clocks."

Described below is the syntax of the commands in one exemplary implementation. The syntax of the "SETup ALgorithm Selection" command may be as follows:

SETup ALgorithm Selection
<-OFf>
|<-ON>[<-All>|<-None>|<algorithm$_1$>... <algorithm$_n$>]

The "-OFf" switch disables on-line algorithm selection, thus maintaining the current behavior of the EDA tool. No additional hardware is added to the controller by turning algorithm selection OFF. The "-ON" switch enables algorithm selection. In this case, the EDA tool adds the necessary hardware to the controller to allow it to select among the implemented algorithms during runtime.

As noted above, the hardware added to implement online algorithm selection depends on the type of the algorithm step sequencer(s) implemented in the controller (i.e., concurrent vs. sequential vs. sequential interleaved. etc.). In general, a number of "skip states" will be used. Depending on the type of sequencer, a minimum of "m" skip states may be needed, where "m" is the number of implemented algorithm(s). For a sequential un-collapsed sequencer, for example, the maximum number of skip states will usually be "m×n," where "n" is the number of memories tested. In some embodiments, the skip states will add to the binary encoding size of the "tstate" (i.e., the algorithm step register variable).

As noted above and as illustrated by FIG. 1, a shift register 12 can be used to hold the "skip"/"no-skip" status of the implemented algorithms. For example, a single bit can be used for every algorithm, irrespective of the type of algorithm step sequencer. This particular embodiment, however, should not be construed as limiting, as additional bits or alternative hardware configurations can be used to select the implemented algorithms.

MUXes may be used to effectuate the algorithm selection process. In particular, and according to one exemplary embodiment, three MUX modules are used for each skip state. The purpose of these MUXs is to select between skipping and not skipping the next algorithm. Based on the skip-bit value from the corresponding memory element of the algorithm selection register, an algorithm is either executed or skipped. In one implementation, the three multiplexed variables comprise the step variable, the mode variable, and the address operation variable.

In one embodiment, the user can optionally specify parameters for the "-ON" switch. These parameters typically affect only the testbench simulation behavior of the EDA tool and/or the reset value of the algorithm selection register. In other words, in this example the necessary hardware will still be generated, even if none of the specified algorithms were selected, the only difference will be the reset value of the algorithm selection register and the default testbench.

The reset value of the algorithm selection register refers to the register's default settings after the register is reset. The testbench that is loaded into the algorithm selection register may also have a default value. In one implementation, for example, the default behaviour of the register is for the register to run only the first algorithm, and the default behavior of the testbench is to run all the algorithms. This means the reset value would be 00 . . . 01 for the register and the testbench would scan in 11 . . . 11.

In one embodiment, the parameter, "-All" will force the generation of an MBIST controller that has on-line algorithm selection hardware and that runs all algorithms when reset. That is, the reset value will be set to run all algorithms (11 . . . 11). The default testbench will also be set to run all algorithms. Similarly, the "-None" parameter can be used to generate all the necessary hardware but with none of the algorithm(s) selected when the register is reset. That is, the reset value will be set to run no algorithms (00 . . . 00). The default testbench will also be set to run no algorithms.

In summary, according to this implementation, the reset value and the value in the testbench will ordinarily be the same, except when no parameter is specified after the "setup algorithm selection -on" command.

In one embodiment, the user can optionally select a separate clock for loading the algorithm selection register. This can be useful, for example, when integrating with boundary scan hardware such as in accordance with JTAG (IEEE Std. 1149.1). The command may be, for instance, "SETup MEmory Clock." A new switch can be added to this command to allow the specification of the Algorithm Selection Clock:

SETup MEmory Clock [-Control|-System|-Test [Noinvert|Invert]]
-Algsel_clk <clk_name>

In one implementation, if the command is not used to define a clock for algorithm selection no separate clock will be created. Instead, the BIST clock will be used for loading the algorithm selection register.

The functionality of the different exemplary switches described above are summarized in the following table:

TABLE 2

Functionality of Exemplary Switches

| Options | Generate Skip State Hardware | algSelectReg reset vector | Testbench vector to scan in |
|---|---|---|---|
| -Off | No | — | — |
| -On | Yes | 000 . . . 01 | 111 . . . 11 |
| -On - All | Yes | 111 . . . 11 | 111 . . . 11 |
| -On - None | Yes | 000 . . . 00 | 000 . . . 00 |
| -On <alg_list> | Yes | The value depends on the list of algorithms added to MBIST controller and the selection list | |

Note: The "alg_list" option is the subset of the list of algorithms that are (or will be) added to the MBIST controller. The list of algorithms added to the controller may be specified, for example, through a command (e.g., "add MBIST algorithm" or "setup MBIST algorithm") or else the default algorithm is selected (e.g., march2).

The following sequence describes commands that may be used in an example of how the MBIST controller may be generated using an EDA tool.

// Add all test algorithms that the MBIST controller will implement (e.g., checkerBoard, march1, col-march1, diagonal, march2, march3, retention CB, topChecker, unique, etc.).

// Alternative 1: select all possible algorithms for activation during runtime.

// Alternative 2: select none of the possible algorithms for use in testing during runtime.

// Alternative 3: select only the "march2" (or one other specified algorithm) algorithm for use in testing during runtime.

// Alternative 4: select plural algorithms (or specified sets of algorithms) for use in testing during run time.

// Alternative 5: select the appropriate alternative for each memory port of multiport memory elements being tested.

A report can optionally be generated to detail the algorithms that have been selected or not selected for testing of a memory element.

Assume for example that the following algorithms have either been selected for running during BIST (those with a yes) or deselected for running (those with a no):

| | | |
|---|---|---|
| checkerBoard | No | |
| march1 | Yes | |
| col_march1 | No | |
| diagonal | No | |
| march2 | Yes | |
| march3 | Yes | |
| retentionCB | No | |
| topChecker | No | |
| unique | No | |

The reset value of the algorithm selection register may also depend on the algorithms selected. The reset vector here will be 000110010. The reset vector can be calculated from the above report as follows:

TABLE 3

Exemplary Calculation of Reset Vector

| Algorithm | Selected | Bit Value | |
|---|---|---|---|
| checkerBoard | No | 0 | LSB |
| march1 | Yes | 1 | |
| col_march1 | No | 0 | |
| diagonal | No | 0 | |
| march2 | Yes | 1 | |
| march3 | Yes | 1 | |
| retentionCB | No | 0 | |
| topChecker | No | 0 | |
| unique | No | 0 | MSB |

In one exemplary embodiment (illustrated in FIG. 1), the loading of the algorithm selection vector is performed as follows:

1. Activate reset for the reset duration (e.g., "rst_1=0")

2. Deactivate reset (e.g. "rst_1=1"). Wait for a cycle or two, if required.

3. Assert algorithm selection scan enable (e.g., "algsel_scan_en=1")

4. Scan in the algorithm selection vector and enable the algorithm selection clock (if it is present).

5. Deassert algorithm selection scan enable (e.g., "algsel_scan_en=0")

6. Wait for a cycle or two.

7. Assert test_h (e.g., "test h=1")

Desirably, the algorithm selection register is loaded after the reset and before the start of BIST. The algorithm selection clock can be free running, as the algorithm selection register is loaded only when scan_en is high. During the time of loading the algorithm selection register, test_h is desirably not activated.

The switch "-Delay_test_h" in command "setup reset duration" will have no effect as test_h will always be asserted after rst_1. In other words, this is the behaviour when algorithm selection is selected.

Figure 3:
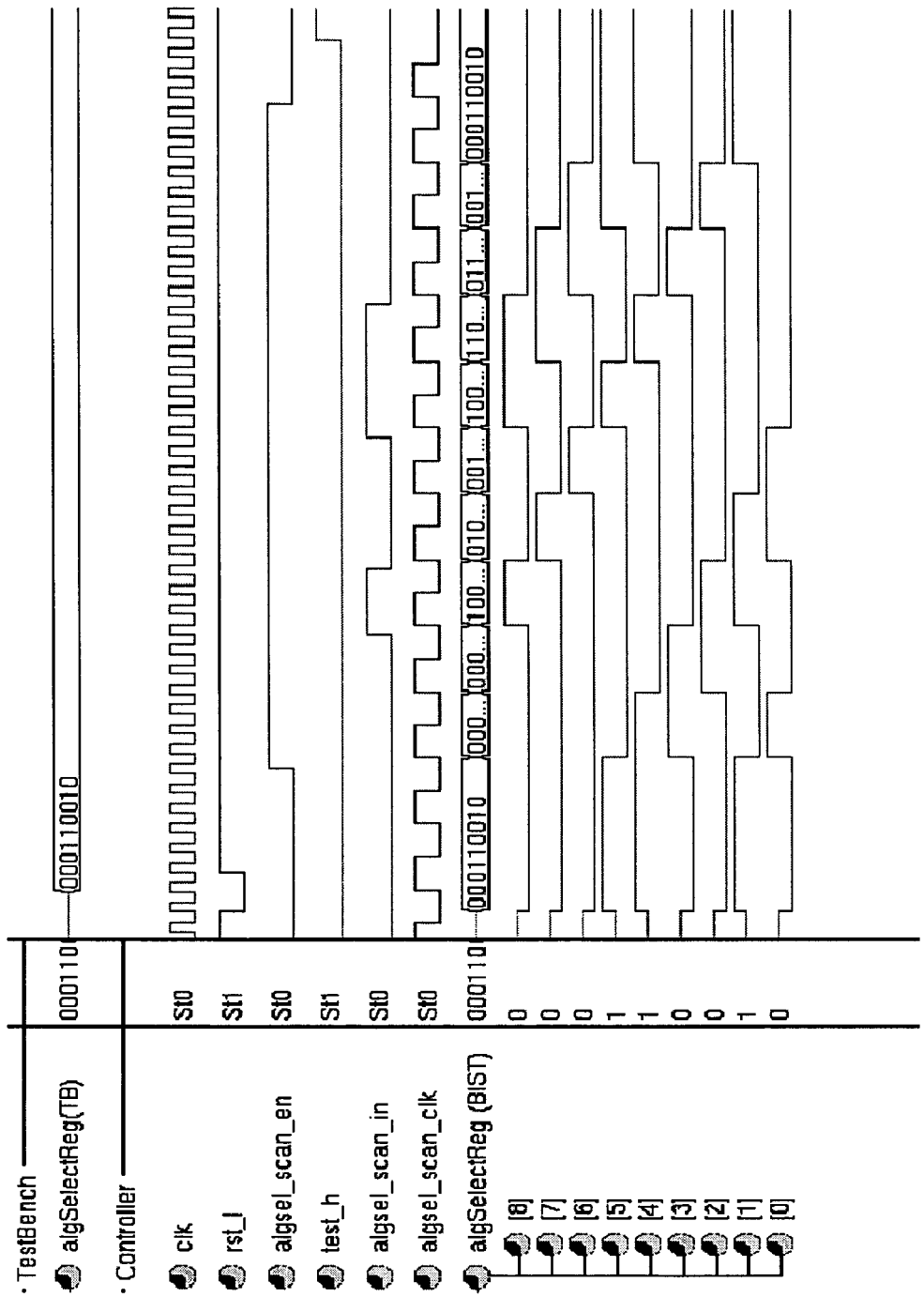
FIGS. 3 and 4 illustrate an exemplary timing diagrams for performing a built-in-self-test of a circuit in accordance with illustrative embodiments.

An exemplary timing diagram is shown in FIG. 3. In FIG. 3, the synchronization between reset, the loading of the algorithm selection register, and the start of BIST is illustrated. FIG. 3 also shows the signals "rst_1," "algsel_scan_en," and "test_h." For the example shown in FIG. 3, the frequency of algsel_scan_clk is chosen to be lower than that of the BIST clock.

The graphical user interface of a relevant EDA software tool can be modified to include several interface features supporting the new command and switches. For example, in one embodiment, the GUI is adapted to show the algorithms that are selected.

III. Multiport Memories

According to one embodiment, online algorithm selection is performed slightly differently for multiport memories. In general, however, the hardware is generated using the same concepts discussed above with skip states at the same places. In this embodiment, the only difference is in the default vector for the testbench (and the reset vector). In the case of multiport memories, an algorithm can be selected or unselected for all the ports.

Consider the following example in which the multiport memory is assumed to be a dual-port memory:

```
BISTGEN> add MBIST algorithms 1 checkerboard march2 unique
diagonal
    BISTGEN> add MBIST algorithms 2 March2 diagonal
March3 col_march1 March1
    BISTGEN> setup algorithm selection -on March2 March3
March1 checkerboard
    BISTGEN> report MBIST algorithms
    Report Algorithms:
        Tests for Port Number 1:
            Algorithm               Selected
            checkerBoard            Yes
            march2                  Yes
            unique                  No
            diagonal                No
        Tests for Port Number 2:
            Algorithm               Selected
            march2                  Yes
            diagonal                No
            march3                  Yes
            col_march1              No
            march1                  Yes
```

As seen from the above example, algorithms "march2, " "march3, " "march1, " and "checkerboard" were selected. "March2" is present on both ports and selected to run, so it is selected to run on both the ports. "March3" is present only on port 2, and so is selected to run only on port 2. In fact, in one implementation, there will be no hardware to allow "march3" to run on port1. "Diagonal" is present on both ports, but it is not selected. Thus, it is not selected to run on both the ports.

IV. Enhancing the Diagnostics Restart Engine

Using embodiments of the algorithm selection architecture described above, the overall performance of MBIST systems that use a restart mechanism to accomplish full-speed (or at-speed) testing can be improved for situations where multiple errors are encountered. Assume the restart approach is used that stops the BIST process when a second error is detected before information relating to a first error is scanned out of a first error register and then restarts the entire BIST process, skipping errors until the cycle immediately after the cycle at which the second error was detected. Alternatively, assume the functionality where a second error register is used with BIST being stopped if an error is encountered before register space is available in either of the first or second error registers for storage of error information. In other words, assume a diagnostic functionality where the BIST is stopped when error information storage space is unavailable.

Because certain embodiments of the disclosed technology include a skip state at the beginning of every algorithm and because algorithms typically start with a write process, the restart point can desirably be set to the first step of the algorithm being applied when the error was detected and no error storage space was available to store the error related information. That is, restarting does not have to rerun previous algorithms that have already been run in the BIST. Having the restart operation return only to the beginning of such algorithm can be beneficial, as it saves significant BIST and diagnostic run time.

As mentioned previously, the MBIST controller may set up a number of variables needed for the next algorithm step during the last cycle of the current algorithm step. The values that need to be set up for a skip_state are typically fixed. They include, for example, such fixed values as "mode_var=md_none," "addr_op=Address No Op." These settings can desirably be used because they make it easy for the skip-state-<N> to set up the values for skip-state-<N+1>.

Thus, it is now easy to have restart set up the values such that the skip state can be switched.

Another issue with the restart mechanism that may need to be addressed in some test architectures is the resetting of various pipeline variables to cancel any unprocessed reads. A separate "branch" in the update process can be used to reset most such variables so it appears as though the skip state has looped for however long the pipeline is. When pipelining is involved, it is desirable that the last reads of an algorithm are completed before the test switches the restart point to the skip_state of the next algorithm. In one embodiment, this functionality is implemented by using a pipelined version of the skip state variable.

Figure 6:
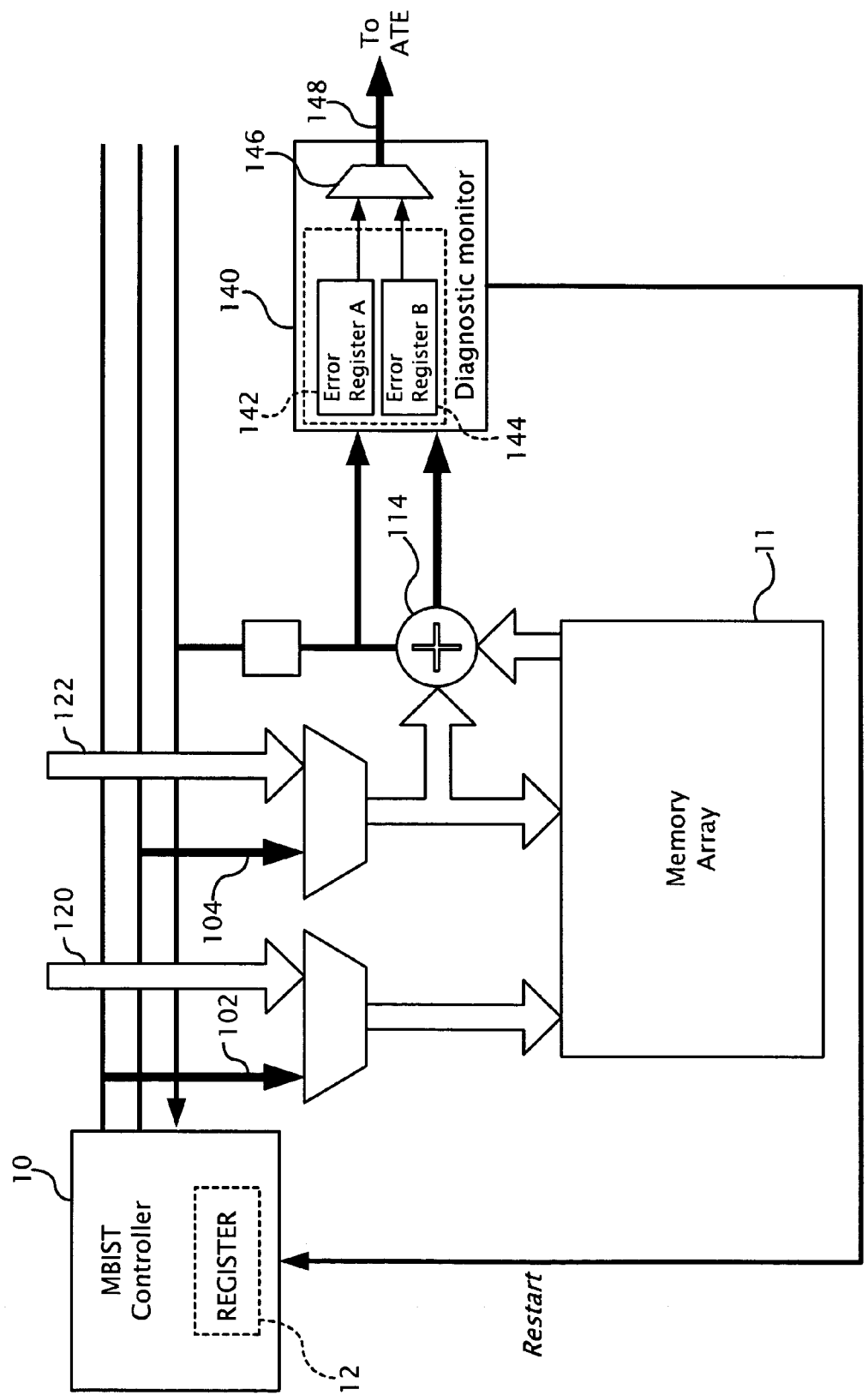
FIG. 6 is a block diagram like that shown in FIG. 5 together with an exemplary diagnostic monitor that can be configured to stop and restart the MBIST controller as described herein.
Figure 8:
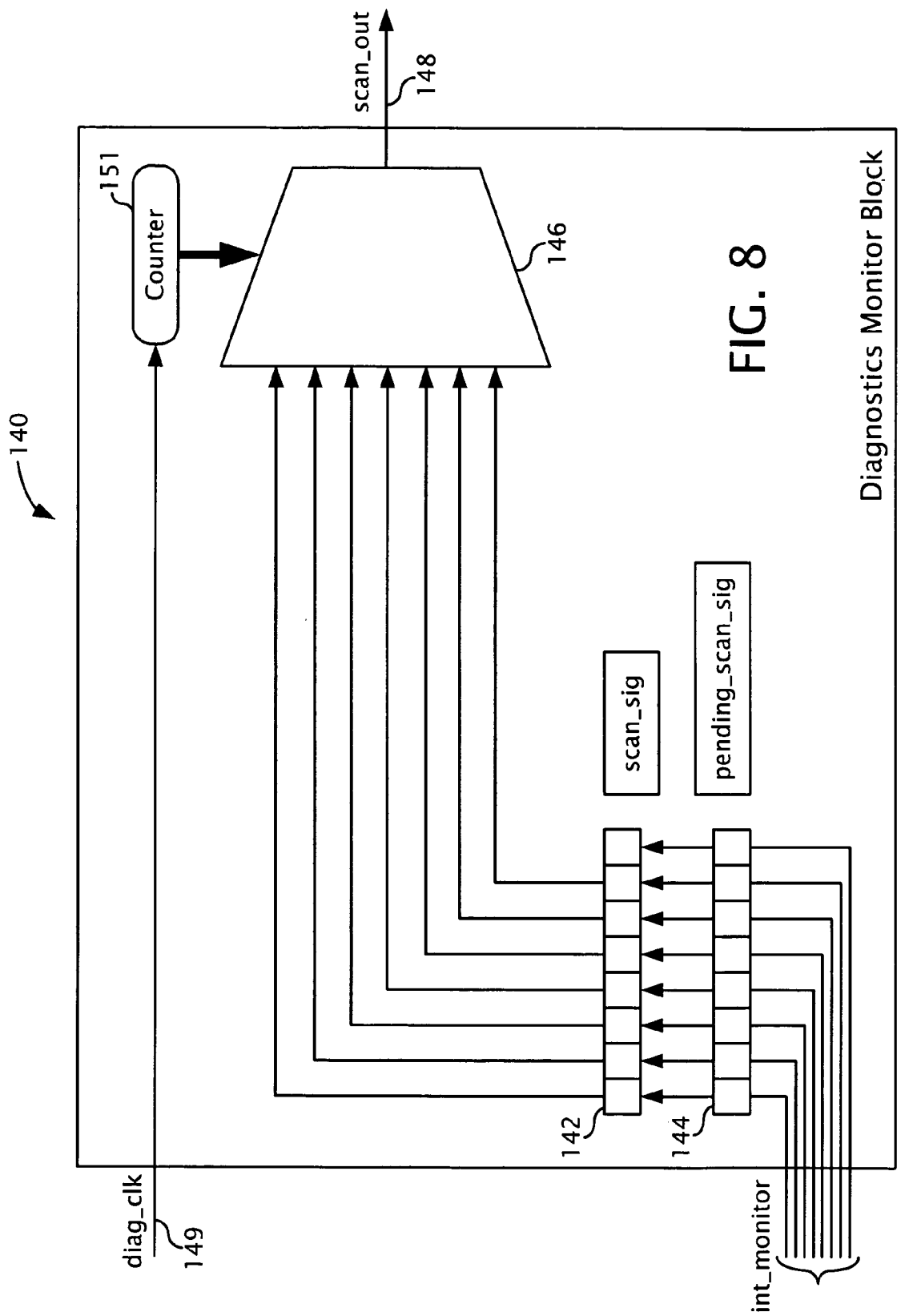
FIG. 8 is a block diagram illustrating in greater detail one form of diagnostic monitor of an exemplary embodiment.

FIG. 6 is a block diagram showing an MBIST controller 10 (configured according to any of the disclosed embodiments) coupled to a memory-under-test 11 and an exemplary diagnostic monitor 140, which can be configured to stop and restart the MBIST controller according to any of the methods described herein. The illustrated diagnostic monitor includes multiple registers (Error Register A or 142 and Error Register B 144) for storing diagnostic information in order to compensate for the possibility of the diagnostic clock being slower than the BIST clock. The registers 142,144 are scanned out through MUX 146 and a line 148 to, in this example, an ATE. FIG. 8 is a block diagram illustrating in greater detail the diagnostic monitor 140 of one exemplary embodiment.

The registers 142,144 operate with the bist_clk (the clock that runs the BIST) and operates at very high speed. When two consecutive errors occur during BIST, they are stored into the two registers shown in FIG. 8. Once two errors are recorded, the BIST controller interrupts the BIST and the failing data is scanned out. This is done using a slower clock-diag_clk (input via line 149). The register outputs are connected to the inputs of multiplexer 146. The select inputs of the multiplexer are connected to a counter 151. The counter 151 counts from one to how many number of bits there are in the error registers. The output of the multiplexer goes to an ATE, that records all the information. The entire circuit is an example of an approach that allows information recorded in one clock domain to be scanned out in another clock domain.

Signal descriptions of exemplary pins in FIG. 8 are as follows:
    TDI, TDO, TMS, TCK—Boundary scan ports (e.g., complaint to JTAG 1149.1 standard).
    clock_dr, shift_dr—These are the internal control signals that are required for the TAP controller (e.g., meeting JTAG 1149.1 standard) to operate correctly.
    pstate—A variable to keep track when the algorithm selection instruction is selected.
    mbist_instruction—A variable to keep track of the instruction to run memory BIST.
    rst_1, algsel_scan_in, algsel_scan_out, algsel_scan_en, test_h—BIST controller signals.
    test_h_1, etc.—are the core signals where the controller pins are connected. For example, the test_h signal is connected to test_h1_1.

While testing multiple memories, the particular manner in which an algorithm is restarted may depend in part on the type of testing being performed by the MBIST controller (e.g., concurrent, sequential, etc.). For concurrent testing, for example, the MBIST controller can be configured to restart at the beginning of the current algorithm and to repeat the testing for all memories. For sequential testing interleaved, the current algorithm can be repeated with all memories being repeated. For sequential non-interleaved, the current algorithm can be restarted, but with only the current memory. Thus, for example, if two errors occur in the last memory, the sequential non-interleaved process would complete execution in less time than the sequential interleaved process.

V. Interface with JTAG (via the BIST Insertion)

In this section, an exemplary JTAG (IEEE Std. 1149.1) interface to an exemplary embodiment of the algorithm selection hardware is defined. In particular, this example is illustrated in one exemplary MBIST environment, though the features and principles disclosed are generally applicable to any relevant EDA software tool. The commands set forth below, and elsewhere here in the Detailed Description, are exemplary only. Other commands designated in alternative ways can be used as well as alternative sequences.

In the described embodiment, JTAG insertion occurs in the following sequence: BIST generation, BIST insertion, and JTAG insertion. In this embodiment, the act of BIST generation should have the algorithm selection feature enabled. The following is an example of a dofile used for BIST generation:

```
load library ram4x4.atpg
  add MBIST algo 1 checkerBoard march1 col_march1 diagonal march2
march3 retentionCB topChecker unique
  set algo sel -on march1 march2 march3
  set memory clock -algsel algsel_scan_clk
  run
  save bist -verilog -script -replace
  exit -d
```

In the exemplary environment, the following things will ordinarily occur with respect to algorithm selection for the dofile shown above: the algorithm selection register will be nine bits wide (nine algorithms have been added) and the reset vector will be 0 0011 <u>0010</u> (9'h032).

The act of BIST insertion is used to "stitch" the controllers and bring the interfaces to the top. The following table is a map of the interfaces (related to algorithm selection) on top with respect to the controller.

TABLE 4

| Pin Mapping | |
| --- | --- |
| Top Level | Connected to Controller |
| algsel_scan_in_1 | algsel_scan_in |
| algsel_scan_en_1 | algsel_scan_en |
| algsel_scan_clk_1 | algsel_scan_clk |
| algsel_scan_out_1 | algsel_scan_out |

In this example, the BIST Insertion dofile is a simple one with no pin mapping. The dofile inserts bscan logic using the dofile "bsda.do." An exemplary bsda file is as follows:

```
load library ram4x4.atpg
set system mode bist
add new controller contr_A -dofile bistgen.do /chip_B/memA
/chip_A/memA
  insert bist logic
  save design chip_rtl.v -replace -include none
  set system mode integration
  insert bscan logic -dof bsda.do
  exit -d
```

For JTAG insertion in this example, the algorithm selection register can be loaded with the values corresponding to the algorithms that are needed to be run.

In this example, the algorithm selection register (algSelectReg) is treated as a core register and hence its input (algselct_scan_in) is connected to TDI. A core register can be defined for the algorithm selection register as:

```
add core register MBIST_algsel_reg algsel_scan_in_1
algsel_scan_out_1 -length 9
```

Next an instruction can be defined for algorithm selection that targets this register:

```
add bscan instruction MBIST_algsel_inst -reg MBIST_algsel_reg
  add port connection algsel_scan_en_1 "MBIST_algsel_inst and
shiftdr"
  add port connection algsel_scan_clk 1 "MBIST_algsel_inst and
clockdr"
```

In some embodiments, the algorithm selection scan enable signal should be active only when the instruction is selected and the hardware is in the shift_dr state. In this situation, the above port connection logic may be required. The algorithm scan clock can be tied to clockdr and can also be "ANDed" with the instruction.

Now suppose that the value "101110100" is to be scanned in. In this exemplary environment, the algsel_scan_in_1 signal is connected to TDI. Thus, this value can be pulsed through TDI when the instruction is selected and the tap controller is in the shift_dr state. This can be done in the testbench, for example, using the following exemplary sequence of acts:

1. Load the instruction for algorithm selection
2. Bring the tap controller into shift-dr state.
3. Shift in the values through TDI and capture the TDO value. (algsel_scan_en will be asserted now as MBIST_algsel_inst and shiftdr will both be high.)
4. Once shifting is done, bring the controller back to the run-test/idle state.

Figure 4:
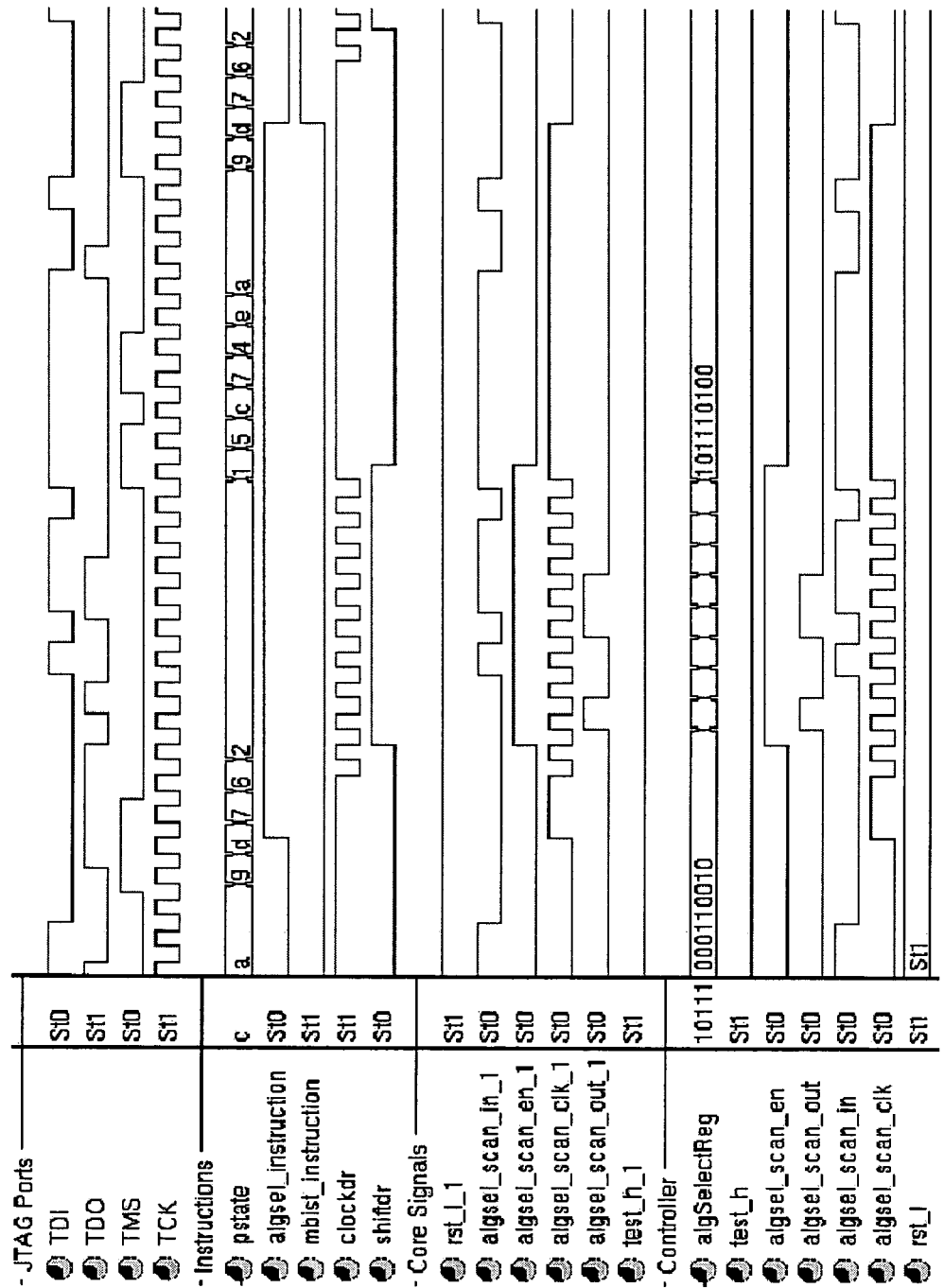

This process is illustrated in FIG. 4 and translates to the following exemplary code in Verilog. Assume for purposes of this example that (1) shift_in=9'b101110100, (2) n_shift_in=n_shift_out=9, (3) tms_r, tdi_r, tdo_r are the registers corresponding to TMS, TDI, and TD, and (4) tck_period is the period of TCK.

The exemplary code is as follows:

```
if (n_shift_out > 0) begin
    tms_r = 1'b1;
    #tck_period;         //enter select-DR-scan
    tms_r = 1'b0;
    #tck_period;         //enter capture-DR-scan
    #tck_period;         //enter shift-DR
    for (i = 0; i < n_shift_out-1; i = i+1)
    begin
        real_out[i] = tdo_s;
        tdi_r = shift_in[i];
        #tck_period;
    end
    real_out[n_shift_out-1] = tdo_s;
    tdi_r= shift_in[n_shift_out -1];
    tms_r = 1'b1;
    #tck_period;         //enter exit1-DR
    #tck_period;         //enter update-DR
end
```

This can also be done through the JTAG command set testbench parameter:

```
set testbench parameters -instr MBIST_algsel_inst -shift_in
  101110100 -shift_out 000110010 -cycle 0.
```

In this example, the shift_out value should be set to the same value as that of the previous shift in or the value of the reset vector (if no values have yet been shifted in). This provides a way to test in the shift register.

Once the instruction is selected, the algorithm selection register can be loaded as above. Once the algorithm selection register has been loaded, the MBIST_instruction can be loaded as done in normal MBIST operations through JTAG. A complete exemplary JTAG dofile having both algorithm selection loading and running MBIST will look like the following:

```
//*** Create Reset register to reset before the start of MBIST
operation
  add bscan instruction MBIST_reg_reset -reg
BSCAN_BYPASS_REG
//******************************************************
//*** Steps to load algorithm selection register ****
//******************************************************
//*** Adding a core register between the algsel scan IOs
  add core register MBIST_algsel_reg algsel_scan_in_1
algsel_scan_out_1 -length 9
//*** Algsel Instruction defined
  add bscan instruction MBIST_algsel_inst -reg MBIST_algsel_reg
//*** Algorithm Selection Scan Enable should be active only when
algse instruction is selected and the tap controller is in shiftdr
state.
  add port connection algsel_scan_en_1
"MBIST_algsel_inst and shiftdr"
//*** Algorithm Selection Clock is tied to clockdr and active
only when the instruction is selected
  add port connection algsel_scan_clk_1
"MBIST_algsel_inst and clockdr"
//*** shift in algorithms needed to run
  set testbench parameters -instr MBIST_algsel_inst -shift_
in 101110100 -shift_out 000110010 -cycle 0
//******************************************************
//*** Now define the registers and interfaces ***
//*** for the BIST operation              ***
//******************************************************
//*** Define register and instruction for MBIST
  add external register MBIST_reg 2
  add bscan instruction MBIST_inst -reg MBIST_reg
//*** For controller at /contr_A
  add port connection bist_clk_1 "buf tck"
  add port connection rst_1_1 "MBIST_reg_reset NAND updateir"
//*** Create The Register Interface And Define
Testbench Parameters
  set external_register interface MBIST_reg -capture  fail_h_1
tst_done_1 -update test_h_1
  set testbench parameters -instr MBIST_inst -shift_in
1 - shift_out 01 -cycle 229
  add nontop port algsel_scan_in_1 algsel_scan_out_1
//*** Run save and quit
  run
  save bscan -replace
  exit -d
```

The resulting timing diagram is shown in FIG. 4.

The pstates are the tap controller states as described in the following table:

TABLE 5

Tap Controller States

| Tap Controller State | Hex Code |
| --- | --- |
| Test-Logic Reset | F |
| Run-Test Idle | D |
| Select-DR-Scan | 7 |
| Capture-DR | 6 |
| Shift-DR | 2 |
| Exit1-DR | 1 |
| Pause-DR | 3 |
| Exit2-DR | 0 |
| Update-DR | 5 |
| Select-IR-Scan | 4 |
| Capture-IR | e |
| Shift-IR | a |
| Exit1-IR | 9 |
| Pause-IR | b |
| Exit2-IR | 8 |
| Update-IR | C |

In certain embodiments, it may be best for JTAG integration if all the controllers have their own sets of pins for algorithm selection. Typically, however, the clock pin can be shared. Additionally, the pins can be made non-top port by using appropriate commands.

VI. MBIST Controller Considerations in General

The following is a discussion of an exemplary MBIST controller state machine and how it can be modified to introduce and utilize skip states in accordance with the principles discussed above.

A. Performance/Area Optimization for the MBIST Controller

As noted above, the MBIST controller can be implemented with minimal or reduced state information to save logic or area. The MBIST controller can also be implemented to minimize or reduce the number of cycles required to run the tests requested by the user. In general, the minimization of area is an attempt to reduce the cost of manufacturing the device in question, whereas minimizing the number of cycles to test it minimizes the time it is on a tester. Such time can be a significant contributor to device cost.

Part of a known MBIST approach is to go from tstate to tstate without any intermediate cycles. One of the implications of this is that some information about the next tstate must be known during the current tstate so that certain decisions can be made at the last cycle of the current tstate so the variables will be ready on the first cycle of the next tstate. An example of this would be if the next state was a pure write-only state, write_enable might need to be asserted for the memory at the state of the first cycle of the next tstate. This approach of setting up for the next algorithm during the last cycle of the previous algorithm typically leads to some additional internal variables—for example, next_mode_var, next_pat_var, and next_tstate.

Although it is theoretically possible to figure out what should be done for an arbitrary tstate, doing so is complex and may not always be practical. This complexity may also require long logic paths, thereby increasing the logic and area necessary to implement the controller.

This set up in the embodiments disclosed herein can be accomplished during a skip state with the set up being performed if the next algorithm then is to be run.

An MBIST controller using this approach would sequence in a fixed sequence starting with a specific first tstate called start_state, progress through states related to algorithms, and end in a state called complete_state. The exact time when each tstate transition occurred might vary based on error detection, but the sequence was fixed. In part, the sequence being fixed was required by the decision to be ready to run the next tstate immediately after the last cycle of the current tstate. The "next" variables described above have to set properly on the cycle before the tstate changes.

B. Restart and Skip States

A restart operation can be used in an MBIST controller to provide full-speed diagnostic capability. The restart concept involves using a diagnostic monitor (or error-reporting section) that detects when it has no more room to store error information and that then asserts a hold signal that stops the MBIST controller and schedules a restart of the BIST process (see, for example, FIG. 6). The diagnostic monitor also records the state information for the cycle just after the cycle at which the last recordable error occurred. After scanning out the error(s), it requests that the main MBIST controller restart itself. When the MBIST controller restarts, it ignores any detected errors until it gets to the cycle recorded by the error_reporting section. On that cycle, normal operations resume.

Typically, the restart operation returned to the first tstate (start_state), which has a known set of initial state variables and does not really do anything. That is, it does not write or read memory and it does not increment its address register. So, at the point at which the error-reporting section requests restart, the update process "knows" all it needs to set up the state information so that it can go to the start_state on the next cycle. Thus, because it is a known and simple state, start_state can be used as the restart point for the restart operation.

Figure 2:
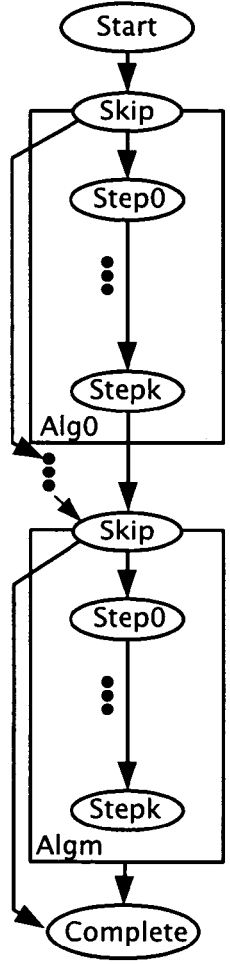
FIGS. 2a-2e comprise block diagrams illustrating exemplary approaches of applying memory test algorithms with skip states.
Figure 2:
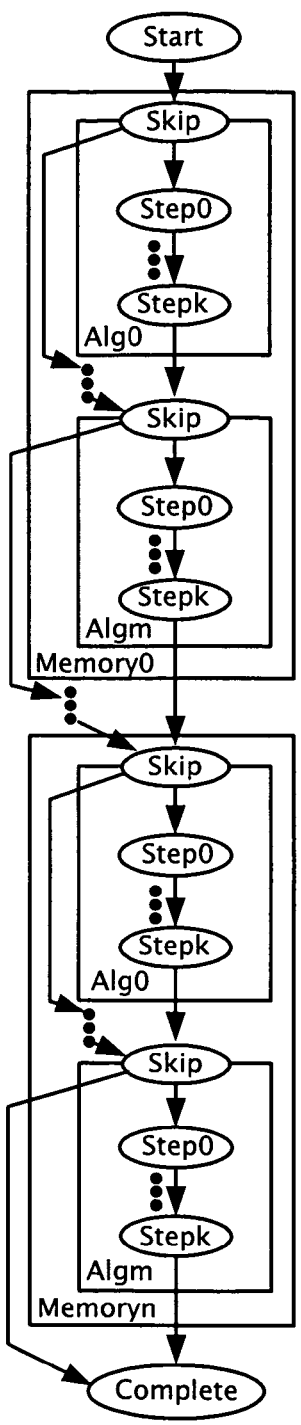
Figure 2:
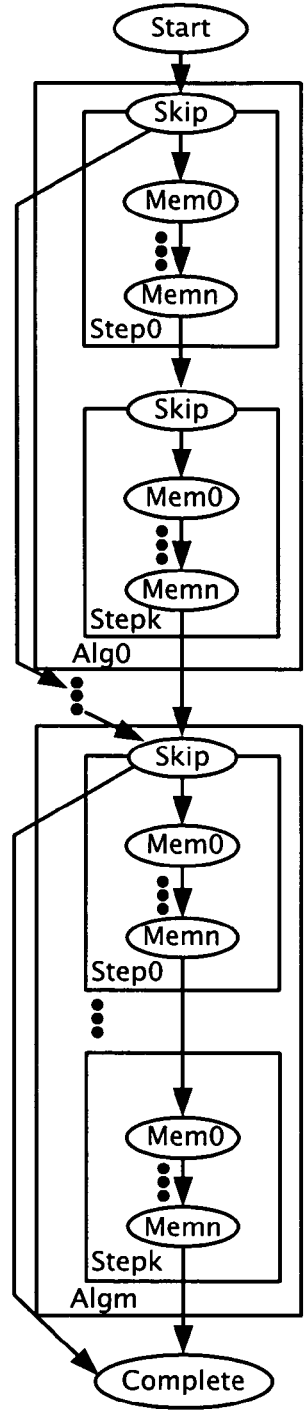
Figure 2:
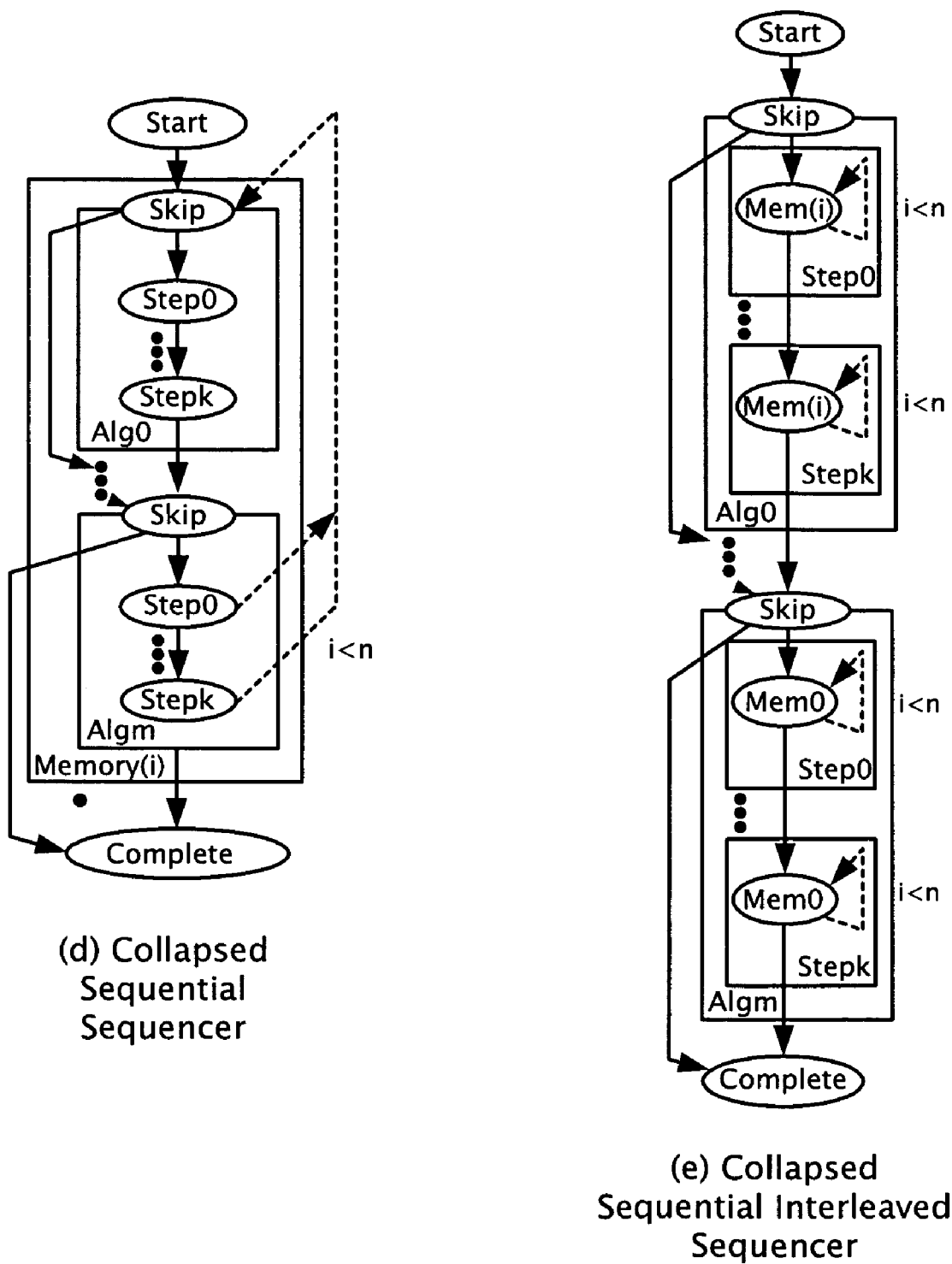

Like start_state, the skip states that are utilized in embodiments of the disclosed architecture desirably comprise simple states. To utilize the skip states, the update process of the MBIST controller can be modified such that when it is at a skip state, it decides whether to continue onto the next state in sequence or to jump to some similarly simple state (e.g., the next skip state). As noted, the update process can be configured to set up for the first cycle of the next step on the last cycle of each step of an algorithm. That next step could be the first step of the next algorithm. As shown in FIG. 2, however, one or more cycles of a simple skip state may be inserted in between these cycles. In this situation, the case block of the tstate of the earlier cycle can get assignments needed to set up the skip state, and the skip state can get the assignments that were originally in the preceding cycle. This can actually simplify some logic that is often on a critical timing path.

Because the skip state has no particular decisions to make with respect to all the processes discussed before, it can afford to look at something else. For example, it can check a single bit signal (e.g., from the algorithm selection register) to decide whether to go on to the next state, using the "next" variables copied from the preceding state, or to "jump" to another pre-calculated skip state.

By placing such simple states between each algorithm chosen by the user and adding a method for defining or setting the bits that cause the update process to jump rather than step, it is possible to select whether all or a subset of algorithms will be run. In certain implementations, the final tstate that can be jumped to from the skip state before the last algorithm is also a "simple" state with no reading, writing, or address operations. Thus, no special processing is needed for the last skip state.

As is suggested by the preceding discussion, the restart mechanism can jump to any simple state (such as a skip state) if it is so desired because the update process could easily be modified to do so. In one particular implementation, the restart point is the skip state that precedes the algorithm where the error was found. Thus, if a restart is performed in the middle of an algorithm, testing is restarted at the beginning of that algorithm. In some embodiments, state information about the cycle at which the error occurred is stored so that errors before that cycle can be ignored after the restart. In some embodiments, if an error is detected due to the very last read of an algorithm (for example, the second read of a read-write-read at the last address), the restart mechanism can point to the skip state of the next algorithm.

One exemplary approach for implementing skip states is to add a new assign to the next_state cases, which sets a variable called next_state. As it updates the tstate value, the update process will set a new state variable called sstate. In some cases, this variable can be referenced directly for determing the simple state at which to restart. In many cases, it may be necessary to look at a version of sstate delayed by one or more cycles. For example, in some cases, the results of a read are not available for several cycles after the read is "sent to memory" (e.g., because the clock speed for sending error data to, for example, an external tester might be slower than the BIST clock). For example, if an error appears in the first read of the last read-write-read of an algorithm, it is possible that the tstate process will have advanced to the next algorithm by the time the error is read. In such a case, the restart point should be the skip_state of the earlier algorithm so that error-checking can be performed for the second read of that last read-write-read.

In general, the restart mechanism described above maintains not only the capacity for at-speed testing of the read-only processes, but also of the write-only processes. For example, even by the second cycle, the write process is running at-speed with the address value (and possibly the data value) toggling at the speed needed to catch some timing-dependent faults.

In connection with on-line algorithm selection, additional hardware is added to implement these techniques. For example, in some embodiments, a register is added that is used to store the vector for selecting algorithms that should be run during BIST. An exemplary register has 4 signals—algsel_scan_clk, algsel_scan_en, algsel_scan_in, and algsel_scan_out. All these are added exclusively for online algorithm selection and can be easily identified in the RTL that the tool generates. In addition, the introduction of the skip states increases the number of tstates in the controller which would otherwise not happen. The tstates are encoded using some number of bits, which changes the hardware required to encode it—as we increase the number of states. For example, if there are 10 algorithms and the total number of tstates without the skip states are 30. This would take 5 bits to encode the tstates. Once the skip states are introduced, the number of tstates will rise to, for example, 40 and would require 6 bits for encoding the same. In other words, there is some additional hardware that is added exclusively for adding the skip states that are necessary for online algorithm selection. This additional hardware in this example, is residual hardware, that remains with the circuit that was tested following the BIST.

Having illustrated and described the principles of the illustrated embodiments, it will be apparent to those skilled in the art that the embodiments can be modified in arrangement and detail without departing from such principles. For example, one or more memories of an integrated circuit may be tested partially with a conventional MBIST architecture and partially with an embodiment of the disclosed MBIST architecture. Further, the functionality of the algorithm selection register described in any of the embodiments can be accomplished using a variety of components, and is not limited to being a shift register. Those of skill in the art will recognize that one or more other components may be substituted in place of the register to accomplish the same or equivalent function. Additional or alternative modifications may be required for certain memory designs. For example, an algorithm commonly exercises the entire address space of a memory. Whenever, there is a step like rwr (read-write-read) for a March algorithm, this means the controller will read, write, and read certain values from every memory location for a particular memory. However, when there are hundreds of embedded memories in a chip and some of them are reasonably large in size, to verify whether the controller operates correctly takes a very long time. Specifically, this means very long simulation times. To alleviate this problem, one can specify an algorithm that only exercises the first and last few address locations of a memory in order to verify whether the controller is working properly. Subsequently, with online algorithm selection, one can add that reduced algorithm to the super-set of algorithms for which the controller will be synthesized. The user could run just the simplified algorithm during simulation, whereas, during manufacturing test, the simplified algorithm could be de-selected from the set of algorithms thereby running all the ones that would test the entire address space for all memories. The ability to specify an address range in conjunction with online algorithm selection provides a very simple way to reduce total simulation time (verification time). Those skilled in the art will recognize that the disclosed embodiments can be easily modified to accommodate different situations and structures.

In view of the many possible embodiments, it will be recognized that the illustrated embodiments include only examples and should not be taken as a limitation on the scope of the invention. Rather, the invention is defined by the following claims. We therefore claim as the invention all such embodiments and their equivalents that come within the scope of these claims.

We claim:

1. A method of performing a built-in-self-test (BIST) of at least one memory element of a circuit, the method comprising:
    running a first testing algorithm on the at least one memory element;
    determining whether to run a second testing algorithm, the act of determining being performed during a delay following the running of the first testing algorithm and comprising evaluating a value associated with the second testing algorithm, wherein the value associated with the second testing algorithm is a value stored in a shift register so as to be associated with the second testing algorithm;
    running the second testing algorithm on the at least one memory element if a determination is made during the determining act that the second testing algorithm is to be run; and
    if a determination is made during the determining act that the second testing algorithm is not to be run, determining whether to run a third testing algorithm, the act of determining comprising evaluating a value associated with the third testing algorithm, wherein the values associated with the second and third testing algorithms are stored in different memory locations.

2. A method according to claim 1 wherein said first testing algorithm is any one algorithm of a set of possible algorithms to be run and wherein said second testing algorithm is another algorithm of the set of possible algorithms to be run.

3. A method according to claim 1 wherein the determining act is performed during running of the built-in-self-test of at least one memory element.

4. A method according to claim 1 wherein the delay comprises a skip state that is reached following the running of the first testing algorithm and prior to the running of the second testing algorithm.

5. A method according to claim 4 comprising the act of the user provision of an instruction or control information of whether to run the second testing algorithm prior to commencement of the running of the built-in-self-test of at least one memory element of the circuit, and the act of checking the user provided instruction or control information during the skip state to determine whether to run the second testing algorithm.

6. A method according to claim 5 wherein the user provided instruction or control information is stored in the shift register at the bit position of the shift register associated with the second testing algorithm.

7. A method according to claim 5 wherein the user provided instruction or control information corresponds to the value stored in the bit position of the shift register associated with the second algorithm, the value being at a first value if running of the second algorithm is to occur, and wherein the act of checking of the user provided instruction or control information comprises the act of checking the value stored in the bit position of the shift register to see if the value stored in the bit position of the shift register is the first value, wherein the act of running the second testing algorithm comprises the act of running the second testing algorithm in the event the value stored in the bit position of the shift register is the first value.

8. A method according to claim 7 wherein there are a plurality of testing algorithms which may be run to conduct the BIST of at least one memory element of the circuit.

9. A method according to claim 8 wherein a skip state is reached prior to the start of the running of each of the testing algorithms.

10. A method according to claim 1 wherein the value associated with the second testing algorithm is stored in the shift register at a bit position associated with the second testing algorithm.

11. A method according to claim 1 further comprising the use of boundary scan hardware to load the value into the bit position of the shift register associated with the second testing algorithm.

12. A method according to claim 1, wherein the first testing algorithm comprises a first step and a second step, wherein running a first testing algorithm on the at least one memory element comprises:
    performing the first step in a first memory element and a second memory element; and
    performing the second step in the first memory element and the second memory element after the performance of the first step in the first and second memory elements.

13. A method according to claim 1, further comprising:
    detecting an error at a given point during the running of the first testing algorithm on the at least one memory element;
    entering a skip state associated with the first testing algorithm;
    restarting the running of the first testing algorithm beginning with the entered skip state; and
    after restarting the running of the first test algorithm, ignoring a recurrence of the detected error at the given point during the running of the first testing algorithm, such that the first testing algorithm continues beyond the given point during the running of the first testing algorithm.

14. A method according to claim 1, wherein the at least one memory element comprises a multiport memory element having a first port and a second port, wherein the running the first testing algorithm on the at least one memory element comprises running the first testing algorithm at the first port, and wherein the running the second testing algorithm on the at least one memory element comprises running the second testing algorithm at the second port.

15. A method according to claim 1, wherein a skip state is associated with the second testing algorithm.

16. A method according to claim 15, wherein the determining whether to run the second testing algorithm occurs at least in part upon reaching the skip state associated with the second testing algorithm.

17. A method according to claim 15, wherein the skip state has a length which is one cycle of a BIST clock which controls the rate at which the first testing algorithm is run.

18. A method according to claim 1, further comprising receiving an indication to selectively reset the running of the first testing algorithm on the at least one memory element if an error in the at least one memory element is detected during the running of the first testing algorithm on the at least one memory element.

19. A method according to claim 1, wherein the first testing algorithm is run at a first clock rate and data is provided to the shift register at a second clock rate.

20. A method of performing a built-in-self-test (BIST) of at least one memory element of a circuit, the method comprising:

running a first testing algorithm;
determining whether to run a second testing algorithm, the act of determining being performed during a delay following the running of the first testing algorithm; and
running the second testing algorithm if a determination is made during the determining act that the second testing algorithm is to be run, wherein the delay comprises a skip state that is reached following the running of the first testing algorithm and prior to the running of the second testing algorithm, and wherein the skip state has a length which is one cycle of a BIST clock which controls the rate at which the first and second testing algorithms are run.

21. A method according to claim 4 wherein in the event the determining act results in a determination to run the second testing algorithm, steps required to set up the second testing algorithm for the running of the second testing algorithm are performed during the skip state.

22. One or more computer-readable storage media comprising instructions configured to cause a computer to generate a design for a circuit having at least one memory element and configured to perform a method of performing a built-in-self-test (BIST) of at least one memory element of the circuit, the method comprising:

running a first testing algorithm on the at least one memory element;
determining whether to run a second testing algorithm, the act of determining being performed during a delay following the running of the first testing algorithm and comprising evaluating a value associated with the second testing algorithm and stored in a shift register so as to be associated with the second testing algorithm;
running the second testing algorithm on the at least one memory element if a determination is made during the determining act that the second testing algorithm is to be run; and
if a determination is made during the determining act that the second testing algorithm is not to be run, determining whether to run a third testing algorithm, the act of determining comprising evaluating a value associated with the third testing algorithm, wherein the values associated with the second and third testing algorithms are stored in different memory locations.

23. One or more computer-readable storage media according to claim 22, wherein said first testing algorithm is any one algorithm of a set of possible algorithms to be run and wherein said second testing algorithm is another algorithm of the set of possible algorithms to be run.

24. One or more computer-readable storage media according to claim 22, wherein the determining act is performed during running of the built-in-self-test of at least one memory element.

25. One or more computer-readable storage media according to claim 22, wherein the delay comprises a skip state that is reached following the running of the first testing algorithm and prior to the running of the second testing algorithm.

26. One or more computer-readable storage media according to claim 25, wherein in the event the determining act results in a determination to run the second testing algorithm, steps required to set up the second testing algorithm for the running of the second testing algorithm are performed during the skip state.

27. One or more computer-readable storage media according to claim 25, the method further comprising the act of the user provision of an instruction or control information of whether to run the second testing algorithm prior to commencement of the running of the built-in-self-test of at least one memory element of the circuit, and the act of checking the user provided instruction or control information during the skip state to determine whether to run the second testing algorithm.

28. One or more computer-readable storage media according to claim 27, wherein the user provided instruction or control information is stored in the shift register at the bit position of the shift register associated with the second testing algorithm.

29. One or more computer-readable storage media according to claim 27, wherein the user provided instruction or control information corresponds to the value stored in the bit position of the shift register associated with the second algorithm, the value being at a first value if running of the second algorithm is to occur, and wherein the act of checking the user provided instruction or control information comprises the act of checking the value stored in the bit position of the shift register to see if the value stored in the bit position of the shift register is the first value, wherein the act of running the second testing algorithm comprises the act of running the second testing algorithm in the event the value stored in the bit position of the shift register is the first value.

30. One or more computer-readable storage media according to claim 29, wherein there are a plurality of testing algorithms which can be run to conduct the BIST of at least one memory element of the circuit.

31. One or more computer-readable storage media according to claim 30, wherein a skip state is reached prior to the start of the running of each of the testing algorithms.

32. One or more computer-readable storage media according to claim 22, wherein the first testing algorithm comprises a first step and a second step, wherein running a first testing algorithm on the at least one memory element comprises:
performing the first step in a first memory element and a second memory element; and
performing the second step in the first memory element and the second memory element after the performance of the first step in the first and second memory elements.

33. One or more computer-readable storage media according to claim 22, wherein the value associated with the second testing algorithm is stored in the shift register at a bit position associated with the second testing algorithm.

34. One or more computer-readable storage media according to claim 33, the method further comprising the use of boundary scan hardware to load the value into the bit position of the shift register associated with the second testing algorithm.

35. An apparatus configured to perform a built-in-self-test (BIST) of at least one memory element of a circuit using a method, the method comprising:
running a first testing algorithm on the at least one memory element;
determining whether to run a second testing algorithm, the act of determining being performed during a delay following the running of the first testing algorithm and comprising evaluating a value associated with the second testing algorithm, wherein the value associated with the second testing algorithm is a value stored in a shift register so as to be associated with the second testing algorithm;
running the second testing algorithm on the at least one memory element if a determination is made during the determining act that the second testing algorithm is to be run; and
if a determination is made during the determining act that the second testing algorithm is not to be run, determining whether to run a third testing algorithm, the act of determining comprising evaluating a value associated with the third testing algorithm, wherein the values associated with the second and third testing algorithms are stored in different memory locations.

36. An apparatus according to claim 35, wherein the determining act is performed during running of the built-in-self-test of at least one memory element.

37. An apparatus according to claim 35, the method further comprising:
detecting an error at a given point during the running of the first testing algorithm on the at least one memory element;
entering a skip state associated with the first testing algorithm;
restarting the running of the first testing algorithm beginning with the entered skip state; and
after restarting the running of the first testing algorithm, ignoring a recurrence of the detected error at the given point during the running of the first testing algorithm, such that the first testing algorithm continues beyond the given point during the running of the first testing algorithm.

38. An apparatus according to claim 35, wherein a skip state is associated with the second testing algorithm.

39. An apparatus according to claim 38, wherein the determining whether to run the second testing algorithm occurs at least in part upon reaching the skip state associated with the second testing algorithm.

40. An apparatus according to claim 38, wherein the skip state has a length which is one cycle of a BIST clock which controls the rate at which the first testing algorithm is run.

41. An apparatus according to claim 38, wherein the value associated with the second testing algorithm is stored in the shift register at a bit position associated with the second testing algorithm.

42. An apparatus according to claim 38, wherein the first testing algorithm comprises a first step and a second step, wherein running a first testing algorithm on the at least one memory element comprises:
performing the first step in a first memory element and a second memory element; and
performing the second step in the first memory element and the second memory element after the performance of the first step in the first and second memory elements.

43. An apparatus according to claim 38, wherein said first testing algorithm is any one algorithm of a set of possible algorithms to be run and wherein said second testing algorithm is another algorithm of the set of possible algorithms to be run.

44. An apparatus according to claim 38, wherein the delay comprises a skip state that is reached following the running of the first testing algorithm and prior to the running of the second testing algorithm.

45. An apparatus according to claim 44, the method further comprising the act of the user provision of an instruction or control information of whether to run the second testing algorithm prior to commencement of the running of the built-in-self-test of at least one memory element of the circuit, and the act of checking the user provided instruction or control information during the skip state to determine whether to run the second testing algorithm.

46. An apparatus according to claim 45, wherein the user provided instruction or control information is stored in the shift register at the bit position of the shift register associated with the second testing algorithm.

47. An apparatus according to claim 45, wherein the user provided instruction or control information corresponds to the value stored in the bit position of the shift register associated with the second algorithm, the value being at a first value if running of the second algorithm is to occur, and wherein the act of checking the user provided instruction or control information comprises the act of checking the value stored in the bit position of the shift register to see if the value stored in the bit position of the shift register is the first value, wherein the act of running the second testing algorithm comprises the act of running the second testing algorithm in the event the value stored in the bit position of the shift register is the first value.

48. An apparatus according to claim 45, wherein there are a plurality of testing algorithms which can be run to conduct the BIST of at least one memory element of the circuit.

49. An apparatus according to claim 48, wherein a skip state is reached prior to the start of the running of each of the testing algorithms.

50. A apparatus according to claim 35, wherein the at least one memory element comprises a multiport memory element having a first port and a second port, wherein the running the first testing algorithm on the at least one memory element comprises running the first testing algorithm at the first port, and wherein the running the second testing algorithm on the at least one memory element comprises running the second testing algorithm at the second port.

51. An apparatus for performing built-in-self-test (BIST) testing of at least one memory element of a circuit, the apparatus comprising:
means for running a first testing algorithm on the at least one memory element;

means for determining whether to run a second testing algorithm, the act of determining being performed during a delay following the running of the first testing algorithm and comprising evaluating a value associated with the second testing algorithm, wherein the value associated with the second testing algorithm is a value stored in a shift register so as to be associated with the second testing algorithm;

means for running the second testing algorithm on the at least one memory element if a determination is made during the determining act that the second testing algorithm is to be run; and means for, if a determination is made during the determining act that the second testing algorithm is not to be run, determining whether to run a third testing algorithm, the act of determining comprising evaluating a value associated with the third testing algorithm, wherein the values associated with the second and third testing algorithms are stored in different memory locations.

* * * * *